United States Patent
Kim et al.

(10) Patent No.: US 9,859,022 B2
(45) Date of Patent: Jan. 2, 2018

(54) MEMORY DEVICE HAVING A SHAREABLE ERROR CORRECTION CODE CELL ARRAY

(71) Applicant: SAMSUNG ELECTRONICS CO., LTD., Suwon-si, Gyeonggi-do (KR)

(72) Inventors: Hyun-joong Kim, Gyeonggi-do (KR); Soo-hyeong Kim, Gyeonggi-do (KR); Sang-hoon Shin, Gyeonggi-do (KR); Ju-yun Jung, Gyeonggi-do (KR); Ho-young Song, Gyeonggi-do (KR); Kyo-min Sohn, Gyeonggi-do (KR); Hae-suk Lee, Gyeonggi-do (KR); Bu-il Jung, Gyeonggi-do (KR); Han-vit Jeong, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 14/722,823

(22) Filed: May 27, 2015

(65) Prior Publication Data
US 2016/0048425 A1   Feb. 18, 2016

(30) Foreign Application Priority Data
Aug. 18, 2014   (KR) .................. 10-2014-0106960

(51) Int. Cl.
G06F 11/10   (2006.01)
G11C 29/52   (2006.01)
G11C 29/04   (2006.01)

(52) U.S. Cl.
CPC .......... G11C 29/52 (2013.01); G06F 11/1048 (2013.01); *G11C 2029/0411* (2013.01)

(58) Field of Classification Search
CPC ........................................ G06F 11/10
USPC ........................... 714/800, 764, 770
See application file for complete search history.

(56) References Cited

U.S. PATENT DOCUMENTS

| | | | |
|---|---|---|---|
| 6,133,640 A | 10/2000 | Leedy | |
| 6,324,120 B2 | 11/2001 | Farmwald et al. | |
| 6,378,020 B2 | 4/2002 | Farmwald et al. | |
| 6,426,916 B2 | 7/2002 | Farmwald et al. | |
| 6,452,863 B2 | 9/2002 | Farmwald et al. | |
| 7,075,851 B2 | 7/2006 | Tanaka | |
| 7,568,146 B2 | 7/2009 | Takahashi et al. | |
| 7,599,205 B2 | 10/2009 | Rajan | |
| 7,623,365 B2 | 11/2009 | Jeddeloh | |
| 7,774,684 B2 | 8/2010 | Bains | |
| 7,864,604 B2 | 1/2011 | David | |
| 8,127,204 B2 | 2/2012 | Hargan | |
| 8,159,853 B2 | 4/2012 | Kim et al. | |
| 8,341,332 B2 | 12/2012 | Ma et al. | |

(Continued)

FOREIGN PATENT DOCUMENTS

KR   1020110080516   7/2011

*Primary Examiner* — Fritz Alphonse
(74) *Attorney, Agent, or Firm* — F. Chau & Associates, LLC

(57) ABSTRACT

A memory device including: an error correction code (ECC) cell array; an ECC engine configured to receive write data to be written to a memory cell array and generate internal parity bits for the write data; and an ECC select unit configured to receive the internal parity bits and external parity bits and, in response to a first level of a control signal, store the internal parity bits in the ECC cell array and, in response to a second level of the control signal store the external parity bits in the ECC cell array.

20 Claims, 18 Drawing Sheets

(56) References Cited

U.S. PATENT DOCUMENTS

| | | |
|---|---|---|
| 8,356,144 B2 | 1/2013 | Hessel et al. |
| 8,479,077 B2 | 7/2013 | Lee et al. |
| 8,495,467 B1 * | 7/2013 | Billing .................. G11C 29/42 |
| | | 714/764 |
| 8,539,313 B2 | 9/2013 | D'Abreu et al. |
| 8,621,324 B2 | 12/2013 | Suh |
| 8,629,542 B2 | 1/2014 | Leedy |
| 8,653,672 B2 | 2/2014 | Leedy |
| 8,806,298 B2 | 8/2014 | Bains |
| 2004/0114454 A1 | 6/2004 | Farmwald et al. |
| 2005/0286331 A1 * | 12/2005 | Ito ......................... G11C 11/406 |
| | | 365/222 |
| 2006/0195774 A1 | 8/2006 | Bowyer et al. |
| 2008/0104459 A1 * | 5/2008 | Uchikawa ........... G06F 11/1068 |
| | | 714/721 |
| 2012/0151300 A1 | 6/2012 | Tillema |
| 2012/0297256 A1 | 11/2012 | Plondke et al. |
| 2013/0100752 A1 | 4/2013 | Chu |
| 2013/0185496 A1 | 7/2013 | Hessel et al. |
| 2013/0290606 A1 | 10/2013 | Alessi et al. |

* cited by examiner

FIG. 14

| CLOCK CYCLE | SEQUENTIAL MANNER | | | | | | | |
|---|---|---|---|---|---|---|---|---|
| C0 | D-00 | D-01 | D-02 | D-03 | D-04 | D-05 | D-06 | D-07 |
| C1 | D-08 | D-09 | D-10 | D-11 | D-12 | D-13 | D-14 | D-15 |
| C2 | D-16 | D-17 | D-18 | D-19 | D-20 | D-21 | D-22 | D-23 |
| C3 | D-24 | D-25 | D-26 | D-27 | D-28 | D-29 | D-30 | D-31 |
| C4 | EXT_ECCP | EXT_ECCP | EXT_ECCP | EXT_ECCP | | | | |

FIG. 15

| CLOCK CYCLE | INTERLEAVED MANNER | | | | | | | |
|---|---|---|---|---|---|---|---|---|
| C0 | D-00 | D-01 | D-02 | D-03 | D-04 | D-05 | D-06 | D-07 |
| C1 | EXT_ECCP | D-08 | D-09 | D-10 | D-11 | D-12 | D-13 | D-14 |
| C2 | D-15 | EXT_ECCP | D-16 | D-17 | D-18 | D-19 | D-20 | D-21 |
| C3 | D-22 | D-23 | EXT_ECCP | D-24 | D-25 | D-26 | D-27 | D-28 |
| C4 | D-29 | D-30 | D-31 | EXT_ECCP | | | | |

MEMORY DEVICE HAVING A SHAREABLE ERROR CORRECTION CODE CELL ARRAY

CROSS-REFERENCE TO RELATED APPLICATION

This application claims priority under 35 U.S.C. §119 to Korean Patent Application No. 10-2014-0106960, filed on Aug. 18, 2014, in the Korean Intellectual Property Office, the disclosure of which is incorporated by reference herein in its entirety.

TECHNICAL FIELD

The inventive concept relates to semiconductor memory devices, and more particularly, to a memory device and a memory system, which have a shareable error correction code (ECC) cell array.

DISCUSSION OF RELATED ART

A memory cell of a memory device, such as a dynamic random access memory (DRAM), stores data according to charges stored in a capacitor. According to process scaling of the DRAM, a capacitance value of the capacitor decreases. In addition, since current leaks from the capacitor, the charges stored in the capacitor are discharged when reading and writing operations are not performed. Accordingly, a bit error rate (BER) increases, thereby deteriorating the reliability of data stored in the memory cell. Consequently, the memory device may perform an error correction code (ECC) function to detect and correct an error bit. Parity bits used for the ECC function may be provided from an external source outside the memory device or self-generated by the memory device.

SUMMARY

An exemplary embodiment of the inventive concept provides a memory device comprising: an error correction code (ECC) cell array; an ECC engine configured to receive write data to be written to a memory cell array and generate internal parity bits for the write data; and an ECC select unit configured to receive the internal parity bits and external parity bits and, in response to a first level of a control signal, store the internal parity bits in the ECC cell array and, in response to a second level of the control signal, store the external parity bits in the ECC cell array.

The write data and the external parity bits are provided from a memory controller.

The control signal is provided from a memory controller.

The ECC select unit operates as a multiplexer that outputs the internal parity bits or the external parity bits in response to the control signal during a write operation.

The ECC select unit operates as a buffer that transmits parity bits from the ECC cell array to the ECC engine or a memory controller in response to the control signal during a read operation.

The memory device is a dynamic random access memory.

An exemplary embodiment of the inventive concept provides a memory system comprising: a memory buffer; and a plurality of memory devices, wherein each memory device has at least one channel and each channel includes: an ECC cell array; an ECC engine configured to receive write data to be written to a memory cell array and generate internal parity bits for the write data; and an ECC select unit configured to receive the internal parity bits and external parity bits and, in response to a first level of a control signal, store the internal parity bits in the ECC cell array and, in response to a second level of the control signal, store the external parity bits in the ECC cell array.

First and second channels are disposed on a first memory device and third and fourth channels are disposed on a second memory device, the first and second memory devices are stacked on each other.

The first and second memory device are connected to each other with through silicon vias.

The memory buffer receives the external parity bits and transmits the external parity bits to the channels.

An exemplary embodiment of the inventive concept provides a memory apparatus comprising: a memory controller configured to generate external parity bits with data; and a memory system including: a memory buffer configured to receive the external parity bits and the data from the memory controller; and a plurality of memory devices, wherein each memory device has at least one channel and each channel includes: an ECC cell array; an ECC engine configured to receive the data from the memory buffer, which is to be written to a memory cell array, and generate internal parity bits for the write data; and an ECC select unit configured to receive the internal parity bits from the ECC engine and the external parity bits from the memory buffer and, in response to a first level of a control signal, store the internal parity bits in the ECC cell array and, in response to a second level of the control signal, store the external parity bits in the ECC cell array.

A first channel is disposed on a first memory device and a second channel is disposed on a second memory device.

The first and second channels are independently operated by the memory buffer.

The external parity bits are transferred from the memory controller to the memory buffer via a data lane.

The external parity bits are transferred after the data is transferred in a sequential transmission.

The external parity bits are interleaved with the data bits in an interleaved transmission.

The external parity bits and the data bits are transferred from the memory controller to the memory buffer at the same time via a parity lane and a data line, respectively.

An exemplary embodiment of the inventive concept provides a memory apparatus comprising: a memory controller including a first ECC engine configured to generate external parity bits with data; and a memory system including: a memory buffer that includes: a second ECC engine configured to receive the data from the memory controller, which is to be written to a memory cell array, and generate internal parity bits for the write data; and an ECC select unit configured to receive the internal parity bits from the second ECC engine and the external parity bits from the memory controller and, in response to a first level of a control signal, store the internal parity bits in an ECC cell array and, in response to a second level of the control signal, store the external parity bits in the ECC cell array, wherein the memory system further includes: a plurality of memory devices, wherein each memory device has at least one channel and each channel includes: an ECC cell array.

A first channel is disposed on a first memory device and a second channel is disposed on a second memory device.

An exemplary embodiment of the inventive concept provides a memory apparatus comprising: a memory controller including a first ECC engine configured to generate external parity bits with data; and a memory system including: a memory buffer that includes: a second ECC engine configured to receive the data from the memory controller, which is to be written to a memory cell array, and generate internal parity bits for the write data, wherein the memory system further includes: a plurality of memory devices, wherein each memory device has at least one channel and each channel includes: an ECC cell array; and an ECC select unit configured to receive the internal parity bits from the second ECC engine and the external parity bits from the memory buffer and, in response to a first level of a control signal, store the internal parity bits in the ECC cell array and, in response to a second level of the control signal, store the external parity bits in the ECC cell array.

A first channel is disposed on a first memory device and a second channel is disposed on a second memory device.

An exemplary embodiment of the inventive concept provides a memory apparatus comprising: a memory controller configured to generate data; and a memory system including: a memory buffer configured to receive the data from the memory controller and generate external parity bits; and a plurality of memory devices, wherein each memory device has at least one channel and each channel includes: an ECC cell array; an ECC engine configured to receive the data from the memory buffer, which is to be written to a memory cell array, and generate internal parity bits for the write data; and an ECC select unit configured to receive the internal parity bits from the ECC engine and the external parity bits from the memory buffer and, in response to a first level of a control signal, store the internal parity bits in the ECC cell array and, in response to a second level of the control signal store the external parity bits in the ECC cell array.

The memory buffer provides the control signal to the ECC select unit.

A first channel is disposed on a first memory device and a second channel is disposed on a second memory device.

An exemplary embodiment of the inventive concept provides a memory controller comprising: an ECC circuit configured to generate ECC parity bits and transmit the ECC parity bits to a plurality of memory devices; and a control signal generation circuit configured to generate a control signal and provide the control signal to the plurality of memory devices, wherein the control signal determines whether the ECC parity bits are to be stored in an ECC cell array of a first memory device of the plurality of memory devices or internal parity bits are to be stored in the ECC cell array of the first memory device.

The memory controller may further comprise a data generation circuit configured to generate data and provide the data to the first memory device.

An exemplary embodiment of the inventive concept provides a method of operating a memory device comprising: receiving write data and external parity bits; generating internal parity bits for the write data; selecting the internal parity bits or the external parity bits in response to a control signal; and storing the selected parity bits in an ECC cell array.

The control signal is provided from a memory controller.

The write data and external parity bits are provided from a memory controller.

BRIEF DESCRIPTION OF THE DRAWINGS

Exemplary embodiments of the inventive concept will be more clearly understood from the following detailed description taken in conjunction with the accompanying drawings in which:

FIGS. 14 and 15 are tables for describing methods of transmitting data and external parity bits from the memory system of FIG. 13, according to an exemplary embodiment of the inventive concept;

DETAILED DESCRIPTION OF THE EMBODIMENTS

Figure 1:
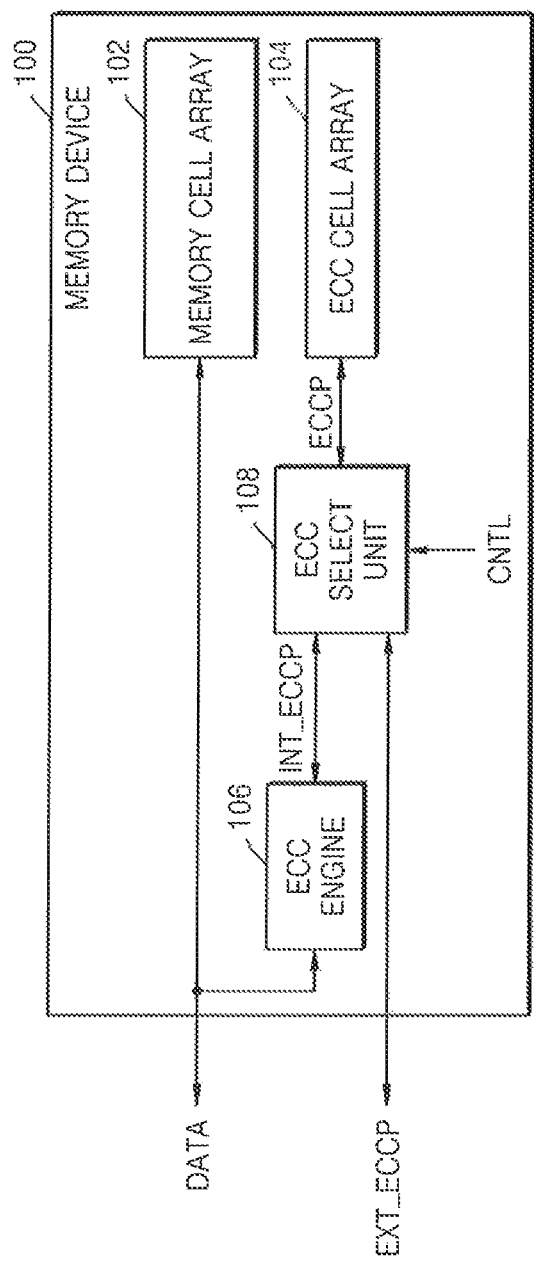
FIG. 1 is a diagram of a memory device having a shareable error correction code (ECC) cell array, according to an exemplary embodiment of the inventive concept.

The inventive concept now will be described more fully hereinafter with reference to the accompanying drawings, in which exemplary embodiments of the inventive concept are shown. This inventive concept may, however, be embodied in many different forms and should not be construed as limited to the embodiments set forth herein. In drawings, like numbers may refer to like elements and sizes of elements may be exaggerated for clarity.

As a memory capacity of a semiconductor memory device, such as a dynamic random access memory (DRAM), is increased, a size of a memory cell is decreased, and a capacitance value of a capacitor of the memory cell is decreased. Due to current leaking from the capacitor, charges stored in the capacitor are discharged over time, and thus the reliability of data stored in the memory cell may deteriorate. The DRAM may provide data integrity by correcting error bits via an error correction code (ECC) algorithm.

The ECC algorithm provides an ECC function for detecting an error that may be generated while storing and reading data, and self-correcting the error. The DRAM may employ an ECC engine therein. The ECC engine performs the ECC operation using parity bits while detecting and correcting an error. Accordingly, the DRAM uses a separate memory region for storing the parity bits. As shown in Table 1 below, the number of correctable data bits increases when the number of parity bits used for the ECC operation increases. Table 1 also shows chip size overheads for each number of parity bits used for the ECC operation.

TABLE 1

| Data bit | Error bit | Parity bit | Chip size overhead |
|---|---|---|---|
| 8 | 1 | 4 | 50% |
| 16 | 1 | 5 | 31% |
| 32 | 1 | 6 | 18% |
| 64 | 1 | 7 | 10% |
| 128 | 1 | 8 | 6% |

In Table 1, 8 parity bits may be required if it is assumed that the ECC operation is performed on data bits in units of 128 bits based on a Hamming code. In the DRAM, about 6% of chip size overhead may be necessary for storing additional 8 parity bits in a memory cell array region with respect to 128 data bits.

The DRAM may include the ECC engine therein to perform the ECC operation on 128 data bits and generate 8 parity bits. The 8 parity bits generated by the DRAM may be stored in a memory cell array region. Hereafter, the ECC engine included in the DRAM will be referred to as an internal ECC engine, and parity bits generated by the internal ECC engine will be referred to as internal parity bits. In addition, a memory cell array, in which parity bits are stored, will be referred to as an ECC cell array.

A memory controller that controls the DRAM may transmit data and parity bits together through a data bus to guarantee integrity of data transmitted to the DRAM. Parity bits provided by the memory controller to the DRAM may be external parity bits. In addition, an ECC engine generating the external parity bits may be an external ECC engine. The external parity bits transmitted to the DRAM may also be stored in a memory cell array region. For example, if 128 data bits and 8 external parity bits are transmitted from the memory controller to the DRAM, the DRAM uses a memory cell array region for storing the 8 external parity bits. Accordingly, because the memory cell array region stores the 8 external parity bits, about 6% of a chip size overhead may be generated.

In an exemplary embodiment of the inventive concept, external parity bits and internal parity bits are stored and shared in one memory cell array region (for example, an ECC cell array) without having to be stored in separate memory cell array regions. Accordingly, the DRAM is able to reduce a chip size overhead generated by parity bits used for the ECC operation.

FIG. 1 is a diagram of a memory device 100 having a shareable ECC cell array 104, according to an exemplary embodiment of the inventive concept.

Referring to FIG. 1, the memory device 100 includes a memory cell array 102, the shareable ECC cell array 104, an internal ECC engine 106, and an ECC select unit 108.

The memory cell array 102 may include a plurality of memory cells arranged in columns and rows. Each memory cell of the memory cell array 102 may include a capacitor and a transistor for storing charges corresponding to data.

Like the memory cell array 102, the shareable ECC cell array 104 includes a plurality of memory cells arranged in columns and rows, wherein each memory cell may include a capacitor and a transistor. The shareable ECC cell array 104 may store ECC parity bits ECCP used for an ECC operation performed on data bits provided to/from the memory cells of the memory cell array 102. Hereafter, the memory cells of the memory cell array 102 will be referred to as normal cells and the memory cells of the shareable ECC cell array 104 will be referred to as ECC cells.

The internal ECC engine 106 may perform an ECC function on data bits written to or read from the memory cell array 102. The ECC function may include a function of calculating ECC parity bits ECCP corresponding to the data bits and a function of detecting and correcting an error bit from among the data bits. The internal ECC engine 106 may generate internal parity bits INT_ECCP with respect to data bits written to the normal cells of the memory cell array 102. The internal ECC engine 106 may perform the ECC operation to detect and correct an error bit included in the data bits read from the normal cells of the memory cell array 102 by using the ECC parity bits ECCP read from the shareable ECC cell array 104.

According to an exemplary embodiment of the inventive concept, the internal ECC engine 106 may generate 8 internal parity bits INT_ECCP with respect to 128 data bits written to the memory cell array 102 and detect and correct an error bit included in the 128 data bits by using the 128 data bits read from the memory cell array 102 and 8 ECC parity bits ECCP read from the shareable ECC cell array 104.

The ECC select unit 108 may receive the internal parity bits INT_ECCP generated by the internal ECC engine 106, and external parity bits EXT_ECCP provided from an external source outside the memory device 100. In response to an ECC control signal CNTL, the ECC select unit 108 may select the internal parity bits INT_ECCP or the external parity bits EXT_ECCP and output the selected internal or external parity bits INT_ECCP or EXT_ECCP as the ECC parity bits ECCP. The ECC parity bits ECCP may be stored in the shareable ECC cell array 104.

In response to the ECC control signal CNTL, the ECC select unit 108 may transmit the ECC parity bits ECCP read from the shareable ECC cell array 104 to the internal ECC engine 106 or the external source that provided the external parity bits EXT_ECCP. When the ECC parity bits ECCP read from the shareable ECC cell array 104 correspond to the internal parity bits INT_ECCP, the ECC select unit 108 may transmit the read ECC parity bits ECCP to the internal ECC engine 106. When the ECC parity bits ECCP read from the shareable ECC cell array 104 correspond to the external parity bits EXT_ECCP, the ECC select unit 108 may transmit the read ECC parity bits ECCP to the external source.

According to an exemplary embodiment of the inventive concept, the ECC select unit 108 may include a multiplexer that selectively outputs the internal or external parity bits INT_ECCP or EXT_ECCP in response to the ECC control signal CNTL.

According to an exemplary embodiment of the inventive concept, the ECC control signal may be provided from a mode register of the memory device 100. The mode register may provide a plurality of operation options of the memory device 100 and may program various functions, characteristics, and modes of the memory device 100.

According to an exemplary embodiment of the inventive concept, the ECC control signal CNTL may be provided by a control signal storage unit of the memory device 100. The control signal storage unit may store control signals for controlling the memory device 100 to perform a write operation, a read operation, or an ECC operation. The control signal storage unit may be a one-time programmable memory, such as a laser-programmable fuse memory, an anti-fuse memory, or an electric programmable fuse memory, or may be a nonvolatile memory device, such as a magnetic random access memory (MRAM), a resistance random access memory (RRAM), a phase change random access memory (PRAM), or a flash memory.

According to an exemplary embodiment of the inventive concept, the ECC control signal CNTL may be provided by a command decoder of the memory device 100. The command decoder may generate the ECC control signal CNTL by decoding an ECC command received from the memory controller.

Figure 2:
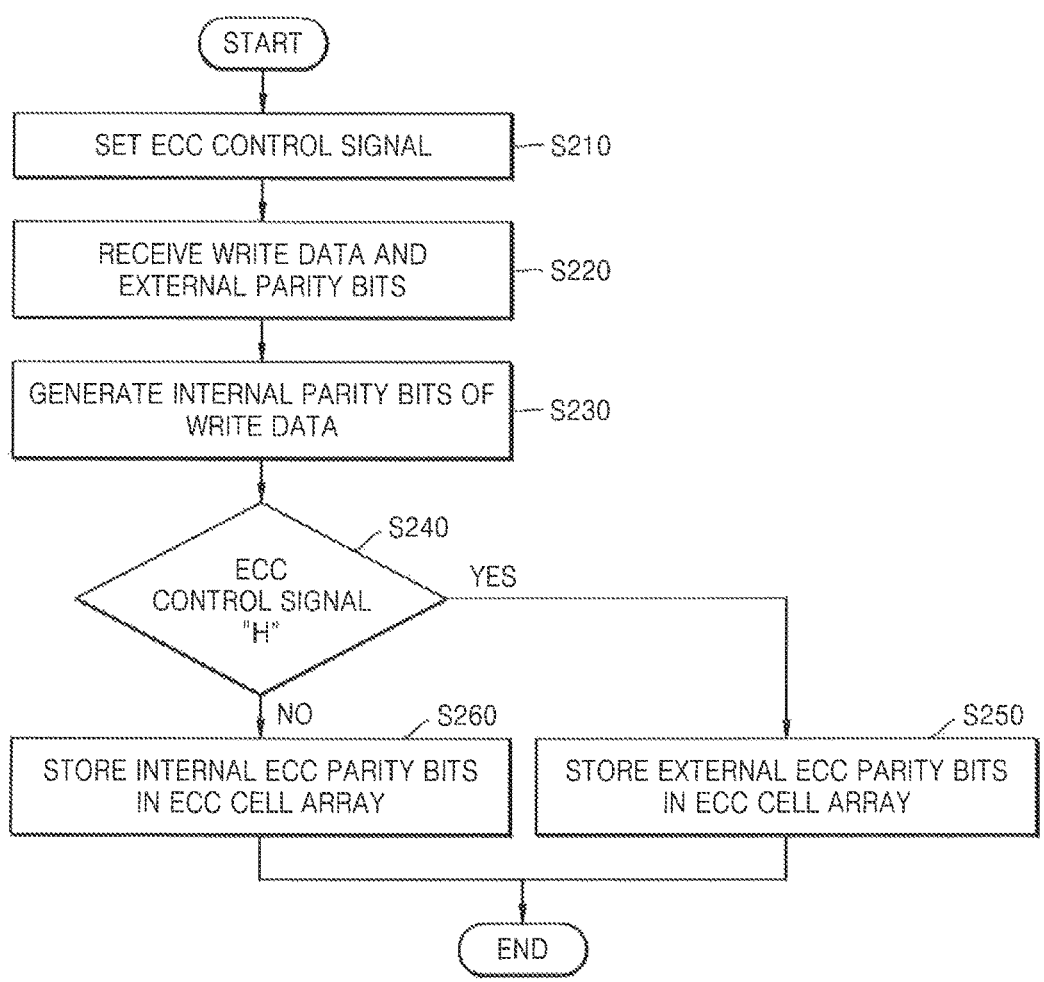
FIG. 2 is a flowchart of a method of operating the memory device of FIG. 1, according to an exemplary embodiment of the inventive concept.

FIG. 2 is a flowchart of a method of operating the memory device 100 of FIG. 1, according to an exemplary embodiment of the inventive concept.

Referring to FIG. 2 and FIG. 1, the ECC control signal CNTL for controlling the ECC operation of the memory device 100 may be set in operation S210. The ECC control signal CNTL may select the internal parity bits INT_ECCP or the external parity bits EXT_ECCP. The ECC control signal CNTL may be provided by the mode register or the control signal storage unit of the memory device 100, or may be generated based on the ECC command received from the memory controller.

The memory device 100 may receive write data to be written to the normal cells of the memory cell array 102, from the memory controller. The memory controller may transmit the external parity bits EXT_ECCP corresponding to the write data to the memory device 100, together with the write data. The memory device 100 may receive the write data and the external parity bits EXT_ECCP, in operation S220. The external parity bits EXT_ECCP may be provided to the ECC select unit 108.

The memory device 100 may perform the ECC operation with the internal ECC engine 106 that receives the write data, and generate the internal parity bits INT_ECCP, in operation S230. The write data may be stored in the memory cell array 102, and the internal parity bits INT_ECCP may be provided to the ECC select unit 108.

The memory device 100 may select the ECC parity bits ECCP to be stored in the shareable ECC cell array 104 in response to the ECC control signal CNTL, in operation S240.

If the ECC control signal CNTL is set to a first logic level (for example, logic high) (Operation S240: YES), the ECC select unit 108 may select and output the external parity bits EXT_ECCP as the ECC parity bits ECCP. The selected external parity bits EXT_ECCP may be transmitted to and stored in the shareable ECC cell array 104, in operation S250. The ECC control signal CNTL may be a single bit of data.

Otherwise, if the ECC control signal CNTL is set to a second logic level (for example, logic low) (Operation S240: NO), the ECC select unit 108 may select and output the internal parity bits INT_ECCP as the ECC parity bits ECCP. The selected internal parity bits INT_ECCP may be transmitted and stored in the shareable ECC cell array 104, in operation S260.

According to the method of the current embodiment, the external parity bits EXT_ECCP may be selected when the ECC control signal CNTL is set to the first logic level and the internal parity bits INT_ECCP may be selected when the ECC control signal CNTL is set to the second logic level, and the selected external or internal parity bits EXT_ECCP or INT_ECCP may be stored in the shareable ECC cell array 104. Accordingly, since the external parity bits EXT_ECCP and the internal parity bits INT_ECCP are stored in the shareable ECC cell array 104, a chip size overhead of the memory device 100 may be reduced.

Figure 3:
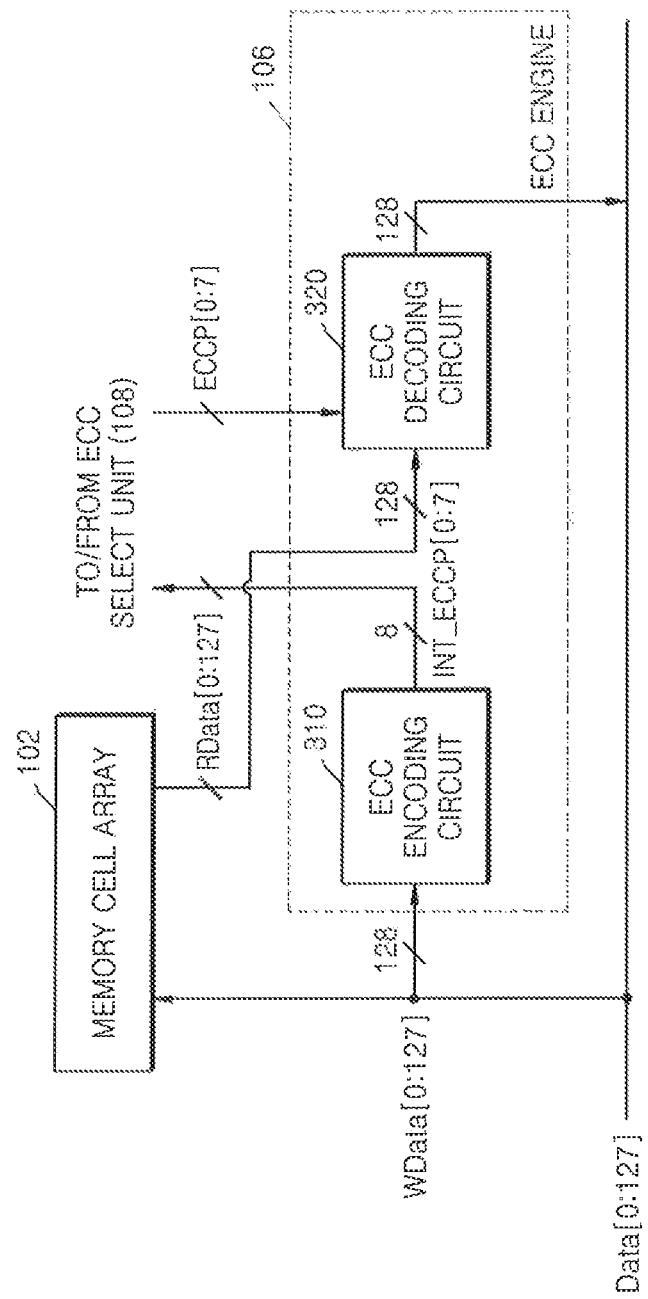
FIG. 3 is a block diagram of an ECC engine according to an exemplary embodiment of the inventive concept.

FIG. 3 is a block diagram of the internal ECC engine 106 according to an exemplary embodiment of the inventive concept.

Referring to FIG. 3, the internal ECC engine 106 may perform the ECC operation on data Data[0:127] written to or read from the normal cells of the memory cell array 102. The normal cells may be one group of a plurality of groups of memory cells in the memory cell array 102, for example. The internal ECC engine 106 may use a [128, 8] Hamming code using 8 parity bits with respect to 128 data bits. According to an exemplary embodiment of the inventive concept, the internal ECC engine 106 may perform the ECC operation on 8, 16, 32, or 64 data bits, as well as 128 data bits. The internal ECC engine 106 may include an ECC encoding circuit 310 and an ECC decoding circuit 320.

The ECC encoding circuit 310 may generate internal parity bits INT_ECCP[0:7] with respect to write data WData[0:127] to be written to the normal cells of the memory cell array 102. The internal parity bits INT_ECCP[0:7] may be transmitted to the ECC select unit 108.

The ECC decoding circuit 320 may receive read data RData[0:127] read from the normal cells of the memory cell array 102 and ECC parity bits ECCP[0:7] from the ECC select unit 108, detect and correct an error bit of the read data RData[0:127] by using the ECC parity bits ECCP[0:7], and output error-corrected data DATA[0:127].

Figure 4:
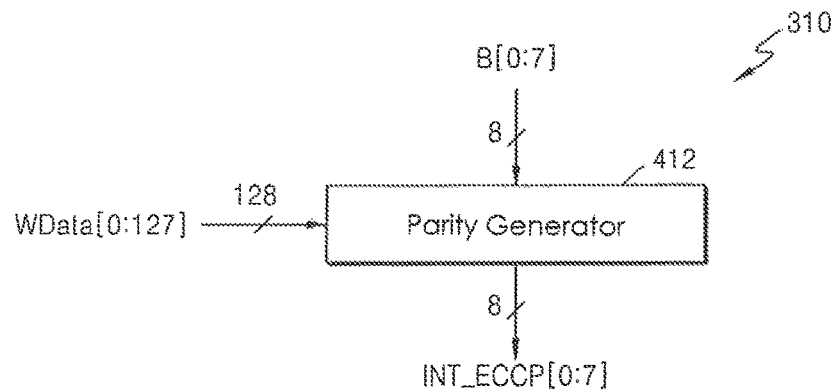
FIG. 4 is a diagram of an ECC encoding circuit of FIG. 3, according to an exemplary embodiment of the inventive concept.

FIG. 4 is a diagram of the ECC encoding circuit 310 of FIG. 3, according to an exemplary embodiment of the inventive concept.

Referring to FIG. 4, the ECC encoding circuit 310 may include a parity generator 412 that receives the write data WData[0:127] in 128 bits and basis bits B[0:7] and generates the internal parity bits INT_ECCP[0:7] by using an XOR operation. The basis bits B[0:7] are bits for generating the internal parity bits INT_ECCP[0:7] with respect to the write data WData[0:127] in 128 bits, and may include, for example, b'00000000 bits. The basis bits B[0:7] may use other bits instead of b'00000000.

Figure 5:
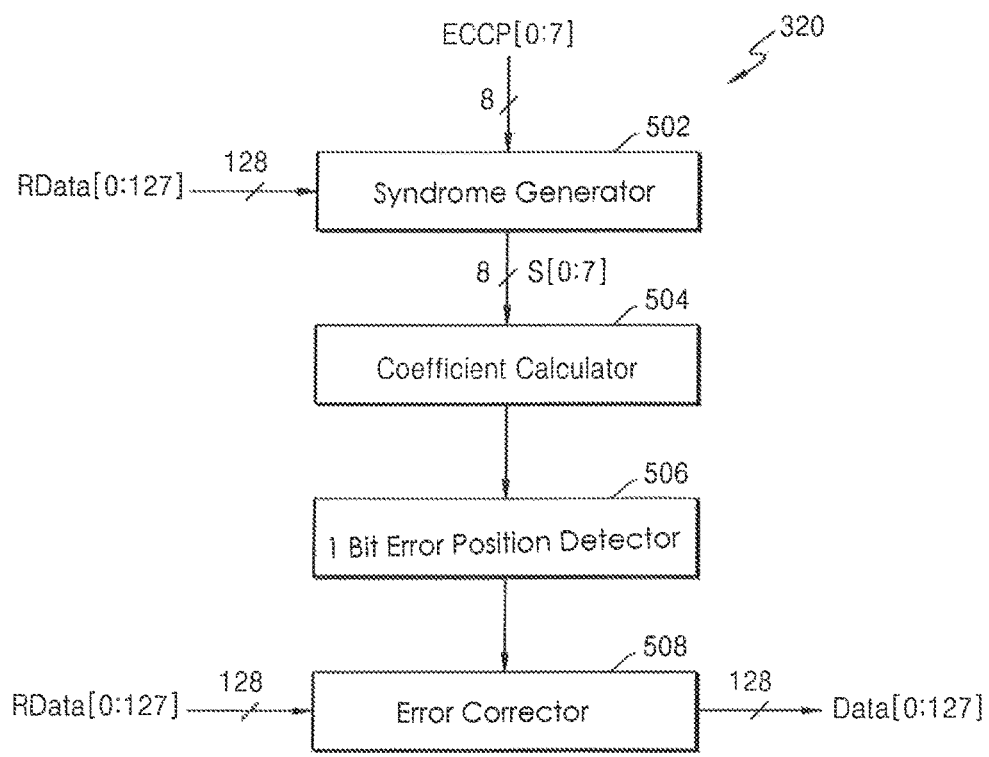
FIG. 5 is a diagram of an ECC decoding circuit of FIG. 3, according to an exemplary embodiment of the inventive concept.

FIG. 5 is a diagram of the ECC decoding circuit 320 of FIG. 3, according to an exemplary embodiment of the inventive concept.

Referring to FIG. 5, the ECC decoding circuit 320 includes a syndrome generator 502, a coefficient calculator 504, a 1 bit error position detector 506, and an error corrector 508. The syndrome generator 502 may receive the read data RData[0:127] in 128 bits read from the memory cell array 102 and the ECC parity bits ECCP[0:7] from the ECC select unit 108 and generate syndrome data S[0:7] by using an XOR array operation. The coefficient calculator 504 may calculate a coefficient of an error position equation by using the syndrome data S[0:7]. The error position equation is an equation that uses a reciprocal of an error bit as a root. The 1 bit error position detector 506 may calculate a position of a 1 bit error by using the calculated error position equation. The error corrector 508 may determine the position of the 1 bit error based on a detecting result of the 1 bit error position detector 506. The error corrector 508 may correct an error by reversing a logic value of a bit having the error from among the read data RData[0:127] in 128 bits according to the determined position of the 1 bit error and output the data Data[0:127] in which the error is corrected.

Figure 6A:
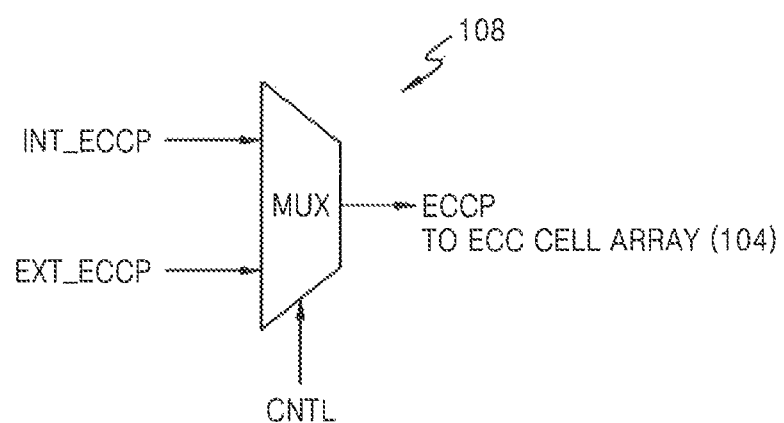
FIGS. 6A and 6B are diagrams of an ECC select unit according to exemplary embodiments of the inventive concept.
Figure 6B:
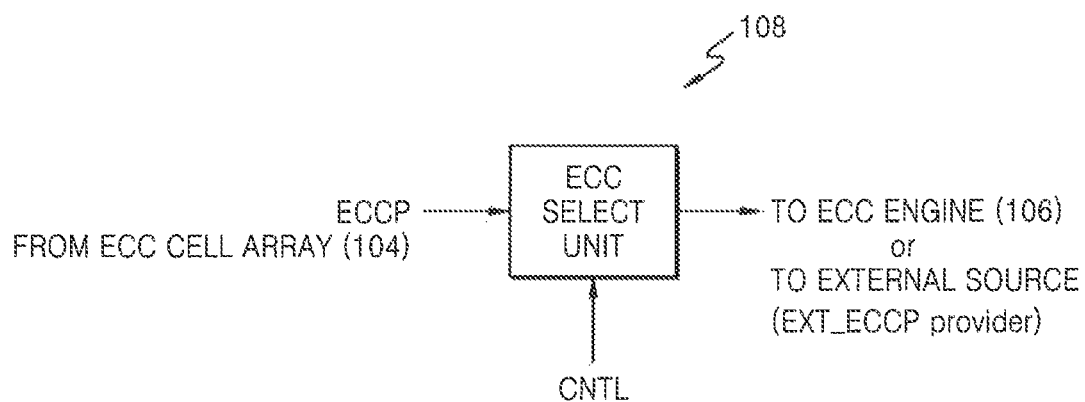

FIGS. 6A and 6B are diagrams of the ECC select unit 108 according to exemplary embodiments of the inventive concept.

Referring to FIG. 6A, during a write operation of the memory device 100, the ECC select unit 108 may operate as a multiplexer that selectively outputs the internal parity bits INT_ECCP or the external parity bits EXT_ECCP. The ECC select unit 108 may receive the internal parity bits INT_ECCP from the ECC encoding circuit 310 of FIG. 3 of the internal ECC engine 106, and the external parity bits EXT_ECCP from the external source outside the memory device 100. In response to the ECC control signal CNTL, the ECC select unit 108 may selectively output the internal parity bits INT_ECCP or the external parity bits EXT_ECCP. The ECC parity bits ECCP output from the ECC select unit 108 may be stored in the shareable ECC cell array 104.

Referring to FIG. 6B, during a read operation of the memory device 100, the ECC select unit 108 may operate as a buffer that transmits the ECC parity bits ECCP read from the shareable ECC cell array 104. In response to the ECC control signal CNTL, the ECC select unit 108 may transmit the ECC parity bits ECCP read from the shareable ECC cell array 104 to the ECC decoding circuit 320 of the internal ECC engine 106. The ECC parity bits ECCP read from the shareable ECC cell array 104 may be the internal parity bits INT_ECCP provided by the internal ECC engine 106. The ECC parity bits ECCP[0:7] received from the ECC select unit 108 may be used by the ECC decoding circuit 320 of FIG. 3 to detect and correct an error bit with respect to the read data RData[0:127] read from the normal cells of the memory cell array 102.

In response to the ECC control signal CNTL, the ECC select unit 108 may transmit the ECC parity bits ECCP read from the shareable ECC cell array 104 to the external source, such as the memory controller. The ECC parity bits ECCP read from the shareable ECC cell array 104 may be the external parity bits EXT_ECCP provided by the memory controller.

Figure 7:
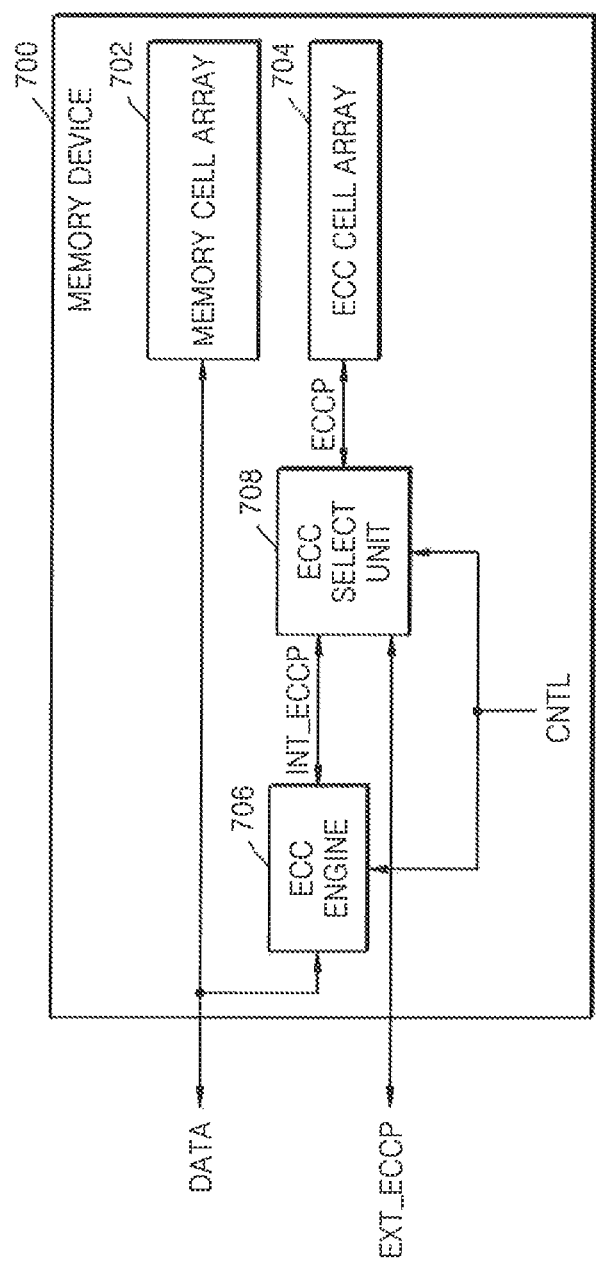
FIG. 7 is a diagram of a memory device having a shareable ECC cell array, according to an exemplary embodiment of the inventive concept.

FIG. 7 is a diagram of a memory device 700 having a shareable ECC cell array 704, according to an exemplary embodiment of the inventive concept.

Referring to FIG. 7, the memory device 700 includes a memory cell array 702, the shareable ECC cell array 704, an internal ECC engine 706, and an ECC select unit 708.

The memory cell array 702 may include a plurality of normal cells arranged in columns and rows, and the shareable ECC cell array 704 may include a plurality of ECC cells arranged in columns and rows. The shareable ECC cell array 704 may store the ECC parity bits ECCP used for the ECC operation performed on data bits provided to and from the normal cells of the memory cell array 702.

The internal ECC engine 706 may perform the ECC operation on data bits written to or read from the memory cell array 702. In response to the ECC control signal CNTL, the internal ECC engine 706 may perform an ECC encoding operation to generate the internal parity bits INT_ECCP with respect to the data bits written to the normal cells of the memory cell array 702. The internal ECC engine 706 may perform an ECC decoding operation to detect and correct an error bit included in the data bits read from the normal cells of the memory cell array 702 by using the ECC parity bits ECCP read from the shareable ECC cell array 704.

The ECC select unit 708 may receive the internal parity bits INT_ECCP generated by the internal ECC engine 706, and the external parity bits EXT_ECCP provided from the external source outside the memory device 700. In response to the ECC control signal CNTL, the ECC select unit 708 may select and output the internal parity bits INT_ECCP or the external parity bits EXT_ECCP, as the ECC parity bits ECCP. The ECC parity bits ECCP may be stored in the shareable ECC cell array 704.

In response to the ECC control signal CNTL, the ECC select unit 708 may transmit the ECC parity bits ECCP read from the shareable ECC cell array 704 to the internal ECC engine 706 or the external source that provided the external parity bits EXT_ECCP.

Figure 8:
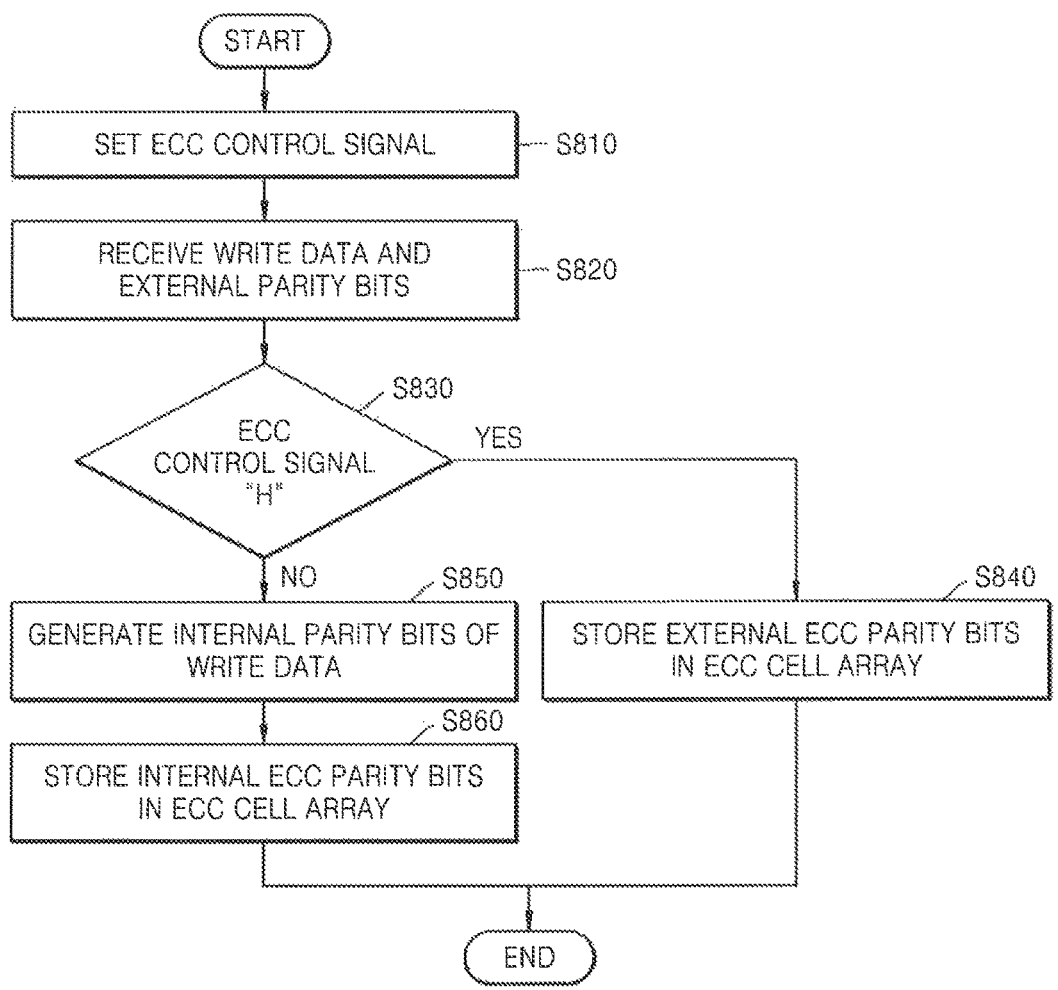
FIG. 8 is a flowchart of a method of operating the memory device of FIG. 7, according to an exemplary embodiment of the inventive concept.

FIG. 8 is a flowchart of a method of operating the memory device 700 of FIG. 7, according to an exemplary embodiment of the inventive concept.

Referring to FIG. 8 and FIG. 7, the ECC control signal CNTL for controlling the ECC operation of the memory device 700 may be set, in operation S810. The ECC control signal CNTL may enable or disable an operation of the internal ECC engine 706 which generates the internal parity bits INT_ECCP. In addition, the ECC control signal CNTL may control the ECC select unit 708 to select the internal parity bits INT_ECCP or the external parity bits EXT_ECCP to be stored in the shareable ECC cell array 704 as the ECC parity bits ECCP and used as parity bits for the ECC decoding operation. The ECC control signal CNTL may be provided by a mode register or a control signal storage unit of the memory device 700, or may be generated based on an ECC command received from a memory controller.

The memory device 700 may receive write data to be written to the normal cells of the memory cell array 702, from the memory controller. The memory controller may transmit the external parity bits EXT_ECCP corresponding to the write data to the memory device 700, together with the write data. The memory device 700 may receive the write data and the external parity bits EXT_ECCP, in operation S820. The external parity bits EXT_ECCP may be provided to the ECC select unit 708.

The memory device 700 may select the ECC parity bits ECCP to be stored in the shareable ECC cell array 704 in response to the ECC control signal CNTL, in operation S830.

If the ECC control signal CNTL is set to a first logic level (for example, logic high) (Operation S830: YES), the ECC select unit 708 may select and output the external parity bits EXT_ECCP as the ECC parity bits ECCP. The selected external parity bits EXT_ECCP may be transmitted to and stored in the shareable ECC cell array 704, in operation S840.

Otherwise, if the ECC control signal CNTL is set to a second logic level (for example, logic low) (Operation S830: NO), the internal ECC engine 706 may receive the write data and, in response to the ECC control signal CNTL, generate the internal parity bits INT_ECCP, in operation S850. The internal parity bits INT_ECCP may be provided to the ECC select unit 708.

The ECC select unit 708 may select and output the internal parity bits INT_ECCP as the ECC parity bits ECCP. The selected internal parity bits INT_ECCP may be transmitted to and stored in the shareable ECC cell array 704, in operation S860.

According to the method of the current embodiment, the external parity bits EXT_ECCP may be selected and stored in the shareable ECC cell array 704 when the ECC control signal CNTL is set to the first logic level and the internal parity bits INT_ECCP with respect to write data may be generated and stored in the shareable ECC cell array 704 when the ECC control signal CNTL is set to the second logic level. Accordingly, since the external parity bits EXT_ECCP and the internal parity bits INT_ECCP are stored in the shareable ECC cell array 704, a chip size overhead of the memory device 700 may be reduced. In addition, when the external parity bits EXT_ECCP are selected and stored in the shareable ECC cell array 704, the ECC encoding operation of the internal ECC engine 706 for generating the internal parity bits INT_ECCP is blocked, and thus current consumption and power consumption may be reduced.

Figure 9:
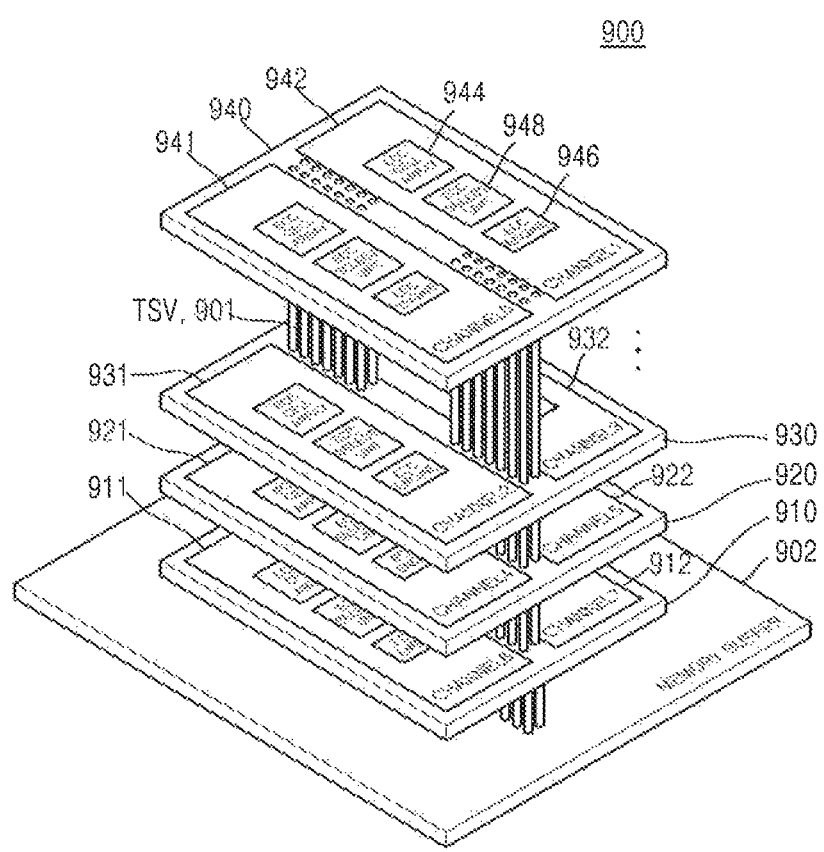
FIG. 9 is a diagram of a memory device in which memory layers each having an ECC cell array are stacked on each other, according to an exemplary embodiment of the inventive concept.

FIG. 9 is a diagram of a memory device 900 in which memory layers 910 through 940 each having an ECC cell array 944 are stacked on each other, according to an exemplary embodiment of the inventive concept.

Referring to FIG. 9, the memory device 900 includes the plurality of memory layers 910 through 940 stacked on each other. The memory layers 910 through 940 may each form a plurality of independent interfaces called channels. The memory layer 910 may include two channels 911 and 912, the memory layer 920 may include two channels 921 and 922, the memory layer 930 may include two channels 931 and 932, and the memory layer 940 may include two channels 941 and 942. The channels 911 through 942 may include independent memory banks and may be independently clocked.

In the memory device 900 according to the current embodiment, the four memory layers 910 through 940 are stacked on each other to form eight channels 911 through 942. According to an exemplary embodiment of the inventive concept, the memory device 900 may include two to eight memory layers stacked on each other. Each of the memory layers 910 through 940 may include one or four channels. A single channel may be distributed throughout the memory layers 910 through 940.

The memory device 900 may further include a memory buffer 902 below the memory layers 910 through 940. The memory buffer 902 may receive a command, an address, a clock, and data from a memory controller and perform a signal distribution function by providing the received command, address, clock, and data to the memory layers 910 through 940. Since the memory buffer 902 buffers all of the command, the address, the clock, and the data, the memory controller may only drive a load of the memory buffer 902 to interface with the memory layers 910 through 940.

The memory buffer 902 and the memory layers 910 through 940 may exchange a signal through a through silicon via (TSV) 901. The memory buffer 902 may communicate with an external memory controller through a conductive unit formed on an outer surface of the memory device 900.

Each of the channels 911 through 942 may include an independent command interface and a data interface. In other words, the channels 911 through 942 are independent from each other. Hereafter, just the channel 941 will be described. Descriptions about the channel 941 may equally apply to the other channels 911 through 932 and 942.

The channel 941 may enable external parity bits and internal parity bits for detecting and correcting an error bit included in data written to or read from the channel 941 to be stored in the ECC cell array 944. The channel 941 may receive the external parity bits provided by the external memory controller outside the memory device 900 through the memory buffer 902. The channel 941 may include an internal ECC engine 946 that receives write data provided from the external memory controller and generates the internal parity bits by performing an ECC encoding operation on the write data. The channel 941 may include an ECC select unit 948 that receives the external parity bits and the internal parity bits, selects the internal parity bits or the external parity bits in response to an ECC control signal, and outputs the selected internal or external parity bits as ECC parity bits. The ECC parity bits may be stored in the ECC cell array 944.

Figure 10:
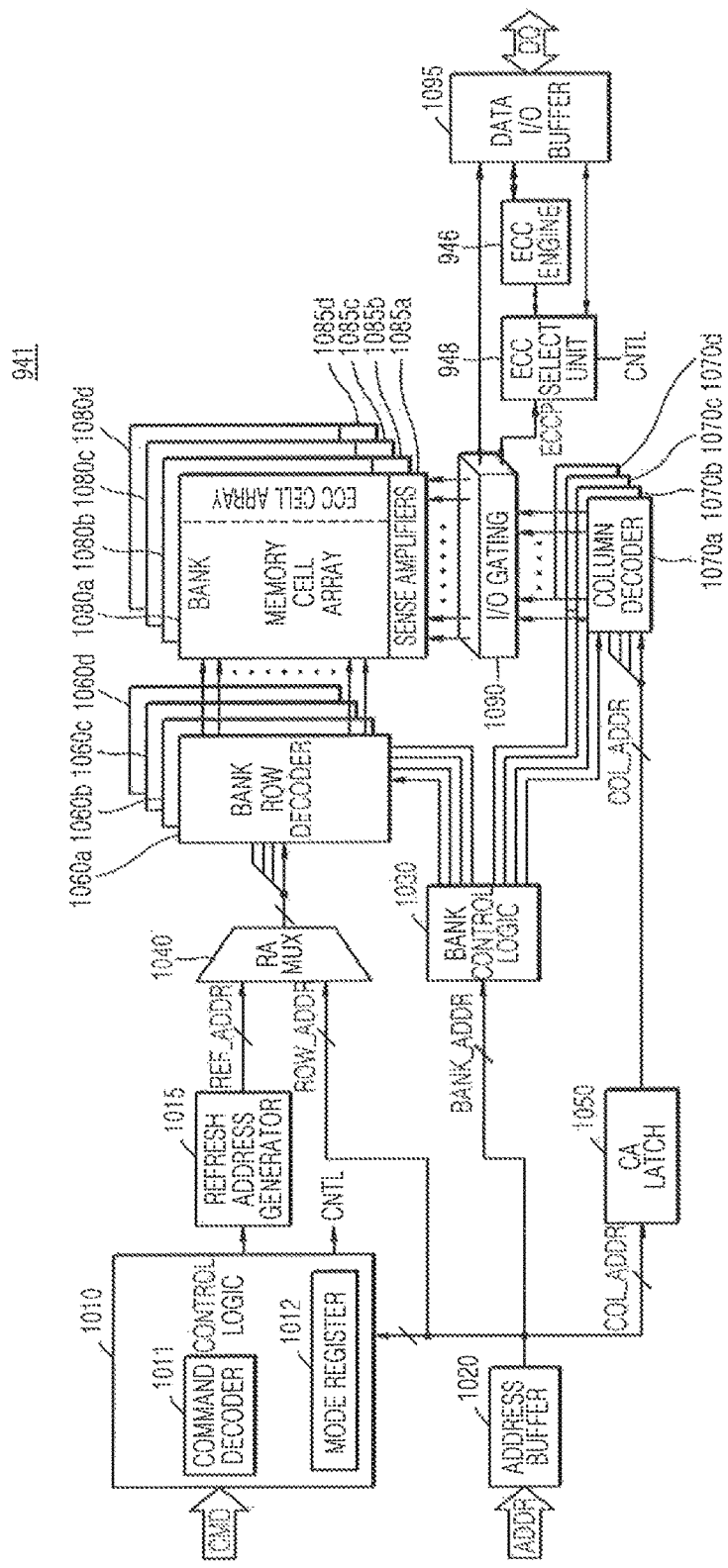
FIG. 10 is a diagram of a channel of the memory layers of FIG. 9, according to an exemplary embodiment of the inventive concept.

FIG. 10 is a diagram of the channel 941 of the memory layers 910 through 940 of FIG. 9, according to an exemplary embodiment of the inventive concept.

Referring to FIG. 10, the channel 941 may include a control logic 1010, a refresh address generator 1015, an address buffer 1020, a bank control logic 1030, a row address multiplexer 1040, a column address latch 1050, a row decoder, a memory cell array, a sense amplifier, an input/output (I/O) gating circuit 1090, a data I/O buffer 1095, the internal ECC engine 946, and the ECC select unit 948.

A memory cell region may include first through fourth bank arrays 1080a through 1080d. Each of the first through fourth bank arrays 1080a through 1080d may include a memory cell array and an ECC cell array. The memory cell array may include a plurality of normal cells arranged in rows and columns, and the ECC cell array may include a plurality of ECC cells arranged in rows and columns. The ECC cell array may store ECC parity bits used for an ECC operation performed on data provided to and from the normal cells of the memory cell array.

The row decoder may include first through fourth bank row decoders 1060a through 1060d respectively connected to the first through fourth bank arrays 1080a through 1080d. A column decoder may include first through fourth bank column decoders 1070a through 1070d respectively connected to the first through fourth bank arrays 1080a through 1080d. The sense amplifier may include first through fourth bank sense amplifiers 1085a through 1085d respectively connected to the first through fourth bank arrays 1080a through 1080d.

The first through fourth bank arrays 1080a through 1080d, the first through fourth bank row decoders 1060a through 1060d, the first through fourth bank column decoders 1070a through 1070d, and the first through fourth bank sense amplifiers 1085a through 1085d may form first through fourth memory banks, respectively. In FIG. 10, the channel 941 includes four memory banks, but according to an exemplary embodiment of the inventive concept, the channel 941 may include any number of memory banks.

In addition, according to an exemplary embodiment of the inventive concept, the channel 941 may be a DRAM, such as a double data rate synchronous DRAM (DDR SDRAM), a low power double data rate (LPDDR) SDRAM, a graphic double data rate (GDDR) SDRAM, or a Rambus DRAM (RDRAM), or any volatile memory device that uses an ECC operation.

The control logic 1010 may control operations of the channel 941. For example, the control logic 1010 may generate control signals such that the channel 941 performs a write operation or a read operation. The control logic 1010 may include a command decoder 1011 that decodes a command CMD received from a memory controller, and a mode register 1012 that sets an operation mode of the channel 941.

The command decoder 1011 may generate control signals corresponding to the command CMD by decoding a write enable signal /WE, a row address strobe signal /RAS, a column address strobe signal /CAS, or a chip select signal /CS. The command decoder 1011 may generate the ECC control signal CNTL by decoding an ECC command received from the memory controller.

The mode register 1012 may provide a plurality of operation options of the channel 941 and program various functions, characteristics, and modes of the channel 941. The mode register 1012 may provide the ECC control signal CNTL for controlling the ECC operation of the channel 941.

The control logic 1010 may include a control signal storage unit that stores control signals for controlling the channel 941 to perform a write operation, a read operation, or an ECC operation. The control signal storage unit may be a one-time programmable memory, such as a laser-programmable fuse memory, an anti-fuse memory, or an electric programmable fuse memory. The control signal storage unit may provide the ECC control signal CNTL for controlling the ECC operation of the channel 941.

The control logic 1010 may further receive differential clocks CK_t and CK_c and a clock enable signal CKE for driving the channel 941 in a synchronized manner. Data of the channel 941 may be operated at a double data rate. The clock enable signal CKE may be captured at a rising edge of the differential clock CK_t.

The control logic 1010 may control the refresh address generator 1015 to perform an auto-refresh operation in response to a refresh command, or to perform a self-refresh operation in response to a self-refresh enter command.

The refresh address generator 1015 may generate a refresh address REF_ADDR corresponding to a memory cell row on which a refresh operation is to be performed. The refresh address generator 1015 may generate the refresh address REF_ADDR in a refresh cycle defined by the standards of volatile memory devices.

The address buffer 1020 may receive an address ADDR including a bank address BANK_ADDR, a row address ROW_ADDR, and a column address COL_ADDR from the memory controller. In addition, the address buffer 1020 may provide the received bank address BANK_ADDR to the bank control logic 1030, provide the received row address ROW_ADDR to the row address multiplexer 1040, and provide the received column address COL_ADDR to the column address latch 1050.

The bank control logic 1030 may generate bank control signals in response to the bank address BANK_ADDR. In response to the bank control signals, a bank row decoder corresponding to the bank address BANK_ADDR from among the first through fourth bank row decoders 1060a through 1060d may be activated, and a bank column decoder corresponding to the bank address BANK_ADDR from among the first through fourth bank column decoders 1070a through 1070d may be activated.

The bank control logic 1030 may generate bank group control signals in response to the bank address BANK_ADDR for determining a bank group. In response to the bank group control signals, row decoders of a bank group corresponding to the bank address BANK_ADDR from among the first through fourth bank row decoders 1060a through 1060d may be activated, and column decoders of the bank group corresponding to the bank address BANK_ADDR from among the first through fourth bank column decoders 1070a through 1070d may be activated.

The row address multiplexer 1040 may receive the row address ROW_ADDR from the address buffer 1020 and the refresh address REF_ADDR from the refresh address generator 1015. The row address multiplexer 1040 may selectively output the row address ROW_ADDR or the refresh address REF_ADDR. The row address ROW_ADDR output from the row address multiplexer 1040 may be applied to each of the first through fourth bank row decoders 1060a through 1060d.

The bank row decoder activated by the bank control logic 1030 from among the first through fourth bank row decoders 1060a through 1060d may decode the row address ROW_ADDR output by the row address multiplexer 1040 and activate a word line corresponding to the row address ROW_ADDR. For example, the activated bank row decoder may apply a word line driving voltage to the word line corresponding to the row address ROW_ADDR.

The column address latch 1050 may receive the column address COL_ADDR from the address buffer 1020 and temporarily store the received column address COL_ADDR. The column address latch 1050 may gradually increase the column address COL_ADDR in a burst mode. The column address latch 1050 may apply the column address COL_ADDR that is temporarily stored or gradually increased to each of the first through fourth bank column decoders 1070a through 1070d.

The bank column decoder activated by the bank control logic 1030 from among the first through fourth bank column decoders 1070a through 1070d may activate a sense amplifier corresponding to the bank address BANK_ADDR and the column address COL_ADDR through the I/O gating circuit 1090.

The I/O gating circuit 1090 may include, together with circuits for gating I/O data, an input data mask logic, read data latches for storing data output from the first through fourth bank arrays 1080a through 1080d, and write drivers for writing data to the first through fourth bank arrays 1080a through 1080d.

Data read from a memory cell array of one of the first through fourth bank arrays 1080a through 1080d and the ECC parity bits ECCP read from the corresponding ECC cell array may be detected and amplified by the sense amplifier, and stored in the read data latches. Data DQ stored in the read data latch may be transmitted to the data I/O buffer 1095 and provided to the memory controller through the memory buffer 902 of FIG. 9. In addition, the data DQ stored in the read data latch may be transmitted to the internal ECC engine 946. The internal ECC engine 946 may detect and correct an error bit included in the data read from the memory cell array by using the ECC parity bits ECCP.

The data DQ to be written to the memory cell array of one of the first through fourth bank arrays 1080a through 1080d may be provided from the memory controller to the data I/O buffer 1095 through the memory buffer 902 of FIG. 9. The memory controller may provide the data DQ and external parity bits corresponding to the data DQ to the data I/O buffer 1095 through the memory buffer 902 of FIG. 9. The data DQ provided to the data I/O buffer 1095 may be written to one bank array with a write driver. In addition, the data DQ provided to the data I/O buffer 1095 may be transmitted to the internal ECC engine 946.

The internal ECC engine 946 may generate internal parity bits with respect to data to be written to the memory cell array. According to an exemplary embodiment of the inventive concept, the internal ECC engine 946 may selectively generate the internal parity bits with respect to the data to be written to the memory cell array, in response to the ECC control signal CNTL. In this case, the channel 941 selects and stores the external parity bits in the ECC cell array, thereby blocking the internal ECC engine 946 from generating the internal parity bits, and thus current consumption and power consumption may be reduced.

The ECC select unit 948 may receive the internal parity bits generated by the internal ECC engine 946 and the external parity bits provided from the memory controller. The ECC select unit 948 may select the internal parity bits or the external parity bits in response to the ECC control signal CNTL and output the selected internal or external parity bits as the ECC parity bits ECCP. The ECC parity bits ECCP may be stored in the ECC cell array. The ECC select unit 948 may transmit the ECC parity bits ECCP read from the ECC cell array to the internal ECC engine 946 or the memory controller, in response to the ECC control signal CNTL.

Figure 11:
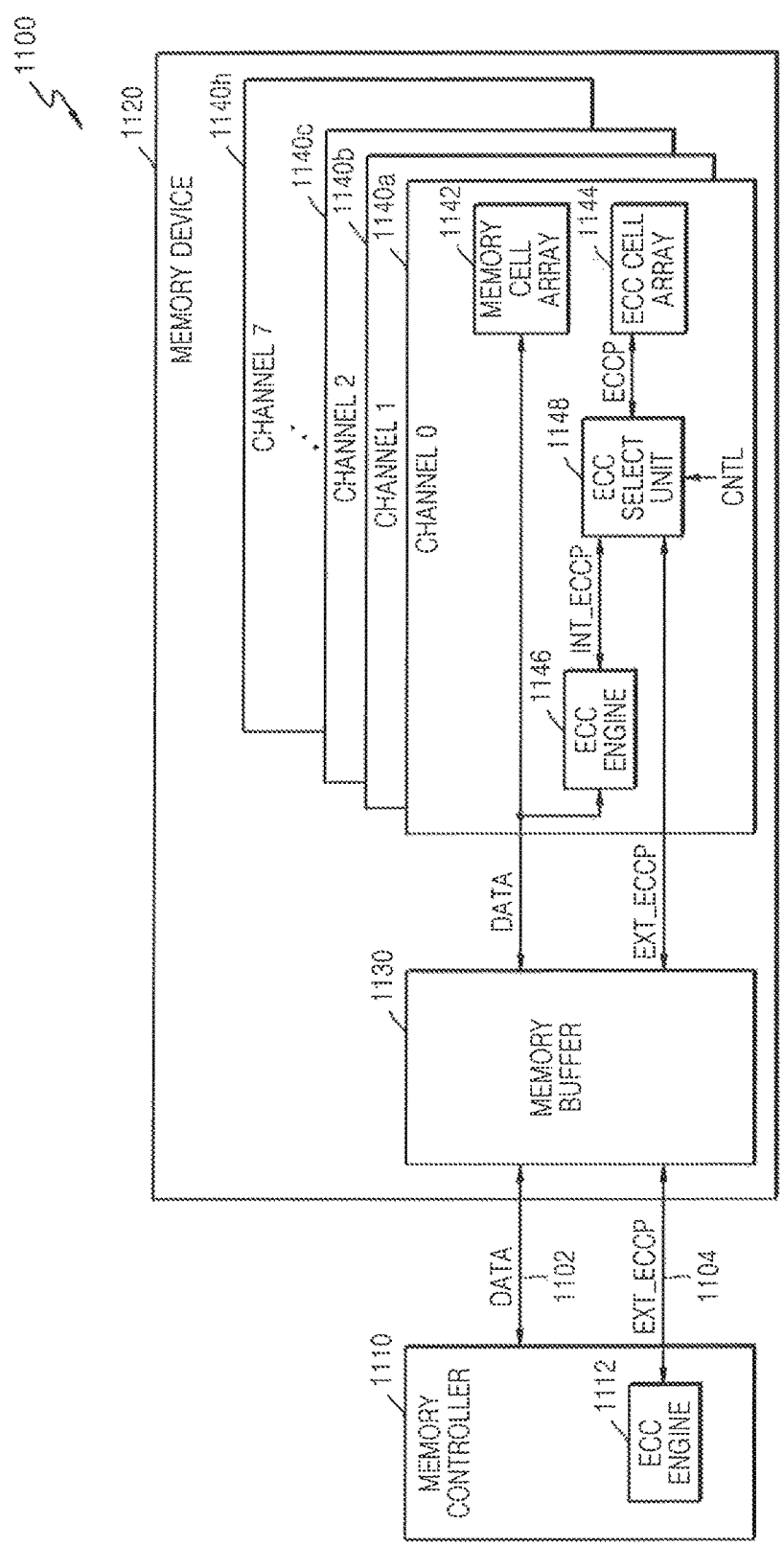
FIG. 11 is a diagram of a memory system including a memory device having a shareable ECC cell array, according to an exemplary embodiment of the inventive concept.

FIG. 11 is a diagram of a memory system 1100 including a memory device 1120 having a shareable ECC cell array 1144, according to an exemplary embodiment of the inventive concept.

Referring to FIG. 11, the memory system 1100 includes a memory controller 1110 and the memory device 1120. The memory device 1120 may be a memory device in which a memory buffer and a plurality of memory layers are stacked on each other as described above with reference to FIG. 9. The memory device 1120 may be connected to the memory controller 1110 through a data bus 1102 for exchanging data with memory layers 1140*a* through 1140*h*, a parity bus 1104 for transmitting the external parity bits EXT_ECCP, and a control bus for transmitting command/address/clock to instruct a read or write operation of data. The memory controller 1110 may be directly connected to a central processing unit (CPU). According to an exemplary embodiment of the inventive concept, the memory controller 1110 may be manufactured as a part of the CPU.

To guarantee the integrity of data transmitted to the memory device 1120, the memory controller 1110 may transmit data DATA and the external parity bits EXT_ECCP corresponding to the data DATA together. The memory controller 1110 may include an external ECC engine 1112 that generates the external parity bits EXT_ECCP by performing an ECC operation on the data DATA. The memory controller 1110 may transmit the data DATA to the memory device 1120 through the data bus 1102 and transmit the external parity bits EXT_ECCP to the memory device 1120 through the parity bus 1104.

The memory device 1120 may include a memory buffer 1130 and the plurality of memory layers 1140*a* through 1140*h*. The memory layers 1140*a* through 1140*h* may be set to channels that include independent memory banks, are independently clocked, and include independent interfaces. The memory buffer 1130 may receive a command, an address, a clock, the data DATA, and the external parity bits EXT_ECCP from the memory controller 1110 and provide the received command, address, clock, data DATA, and external parity bits EXT_ECCP to the memory layers 1140*a* through 1140*h*.

The memory buffer 1130 may include a circuit such as a signal distribution circuit, a signal reproducing circuit, or a signal synchronization circuit. The memory buffer 1130 may include, for example, a capacitive separation circuit, a voltage converting circuit including a voltage rising function, and a voltage dropping function, and a multiplexing/de-multiplexing block including circuitry for a multiplexing function and a de-multiplexing function.

The capacitive separation circuit may provide termination to the data and parity buses 1102 and 1104 and enable the data and parity buses 1102 and 1104 to operate at a high frequency with very limited impedance discontinuity on the data and parity buses 1102 and 1104. Impedance discontinuity may cause a reflection in a waveform that limits a maximum frequency on the data and parity buses 1102 and 1104. A frequency of the data and parity buses 1102 and 1104 may increase at a high rate according to the lower impedance discontinuity on the data and parity buses 1102 and 1104. If the memory buffer 1130 includes a high speed interface, the memory layers 1140*a* through 1140*h* may not need a high speed logic and may have low manufacturing costs.

The voltage converting circuit may change a voltage range of each individual signal input to the memory buffer 1130 through the data and parity buses 1102 and 1104. The voltage converting circuit may include a voltage rising circuit for changing a voltage from a range corresponding to an output of the memory controller 1110 to a range corresponding to an input of the memory layers 1140*a* through 1140*h*. The voltage converting circuit may change a voltage range of each individual signal output from the memory layers 1140*a* through 1140*h*. The voltage converting circuit may include a voltage dropping circuit for changing a voltage from a range corresponding to an output of the memory layers 1140*a* through 1140*h* to a range corresponding to an input of the memory controller 1110.

A de-multiplexing circuit of the multiplexing/de-multiplexing block may process an input having "n" components, and de-multiplex the input to generate an output having "m" components, where n is less than m. Therefore, an input bit rate for each line may be reduced at an n/m ratio to maintain bandwidth of an input side constant with that at an output side of the de-multiplexing circuit. Accordingly, the buses having data input lines to the memory buffer 1130, which are narrower than those to the memory layers 1140*a*-1140*h*, may be used. This approach may reduce the number of pins included in the memory device 1120.

A multiplexing circuit of the multiplexing/de-multiplexing block processes an input having "m" lines, and multiplexes the input to generate an output having "n" lines. Thus, an input bit rate for each line may be increased by a ratio of m/n to maintain the bandwidth at the input side constant with that at the output side of the multiplexing circuit. Accordingly, the number of data line inputs to the memory buffer 1130 may be less than that to the memory layers 1140*a*-1140*h*, and thus, the number of pins included in the memory device 1120 may be reduced.

The memory layer 1140*a* will now be described from among the memory layers 1140*a* through 1140*h*. Descriptions about the memory layer 1140*a* may be equally applied to the other memory layers 1140*b* through 1140*h*. The memory layer 1140*a* may receive a command, an address, a block, the data DATA, and the external parity bits EXT_ECCP through the memory buffer 1130. The memory layer 1140a may include a memory cell array 1142, the shareable ECC cell array 1144, the internal ECC engine 1146, and the ECC select unit 1148.

The memory cell array 1142 may include a plurality of normal cells arranged in rows and columns, and the shareable ECC cell array 1144 may include a plurality of ECC cells arranged in rows and columns. The shareable ECC cell array 1144 may store the ECC parity bits ECCP used for an ECC operation performed on data bits provided to and from the normal cells of the memory cell array 1142.

The internal ECC engine 1146 may perform an ECC function on data bits written to or read from the memory cell array 1142. The internal ECC engine 1146 may perform an ECC encoding operation to generate the internal parity bits INT_ECCP with respect to the data bits written to the normal cells of the memory cell array 1142. The internal ECC engine 1146 may perform an ECC decoding operation to detect and correct an error bit included in the data bits read from the normal cells of the memory cell array 1142 by using the ECC parity bits ECCP read from the shareable ECC cell array 1144.

The ECC select unit 1148 may receive the internal parity bits INT_ECCP generated by the internal ECC engine 1146 and the external parity bits EXT_ECCP provided from the external ECC engine 1112 of the memory controller 1110. The ECC select unit 1148 may select the internal parity bits INT_ECCP or the external parity bits EXT_ECCP in response to the ECC control signal CNTL and output the selected internal parity bits INT_ECCP or external parity bits EXT_ECCP as the ECC parity bits ECCP. The ECC parity bits ECCP may be stored in the shareable ECC cell array 1144.

The ECC select unit 1148 may transmit the ECC parity bits ECCP read from the shareable ECC cell array 1144 to the internal ECC engine 1146 or to the memory controller 1110 through the memory buffer 1130, in response to the ECC control signal CNTL. The ECC control signal CNTL may be provided from a mode register or a control signal storage unit of the memory layer 1140a, or may be generated based on an ECC command received from the memory controller 1110.

Figure 12:
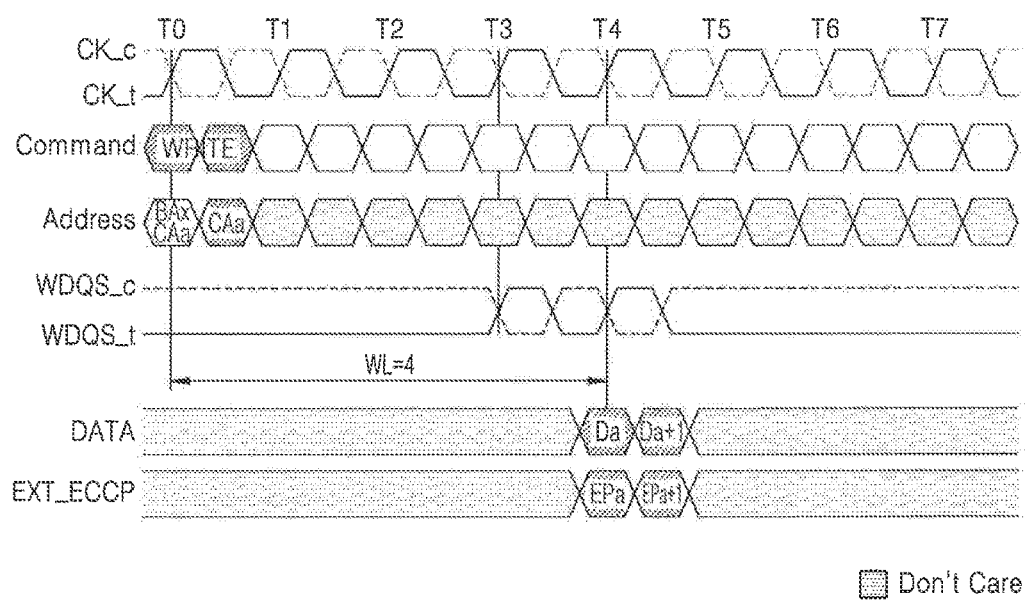
FIG. 12 is a timing diagram for describing transmission of data and external parity bits in the memory system of FIG. 1, according to an exemplary embodiment of the inventive concept.

FIG. 12 is a timing diagram for describing transmission of data DATA and external parity bits EXT_ECCP in the memory system 1100 of FIG. 11, according to an exemplary embodiment of the inventive concept.

Referring to FIG. 12, the memory controller 1110 may transmit a write command to the memory device 1120 according to a rising edge and a falling edge of the differential clocks CK_t and CK_c. The memory controller 1110 may transmit the write command WRITE and addresses BAx and CAa of the memory cell array 1142 of the memory layer 1140a in which data is to be stored, at a time T0. In response to the write command WRITE, the memory layer 1140a may generate differential write strobe signals WDQS_t and WDQS_c.

The memory controller 1110 may transmit the data DATA and the external parity bits EXT_ECCP corresponding to the data DATA after a clock cycle corresponding to a write latency WL from the time T0. For example, when write latency WL is 2 and a write burst BL is 2, first burst data Da and second burst data Da+1 may be transmitted through the data bus 1102 and external parity bits EPa and EPa+1 corresponding to the first and second burst data Da and Da+1 may be transmitted through the parity bus 1104, at a time T4.

Figure 13:
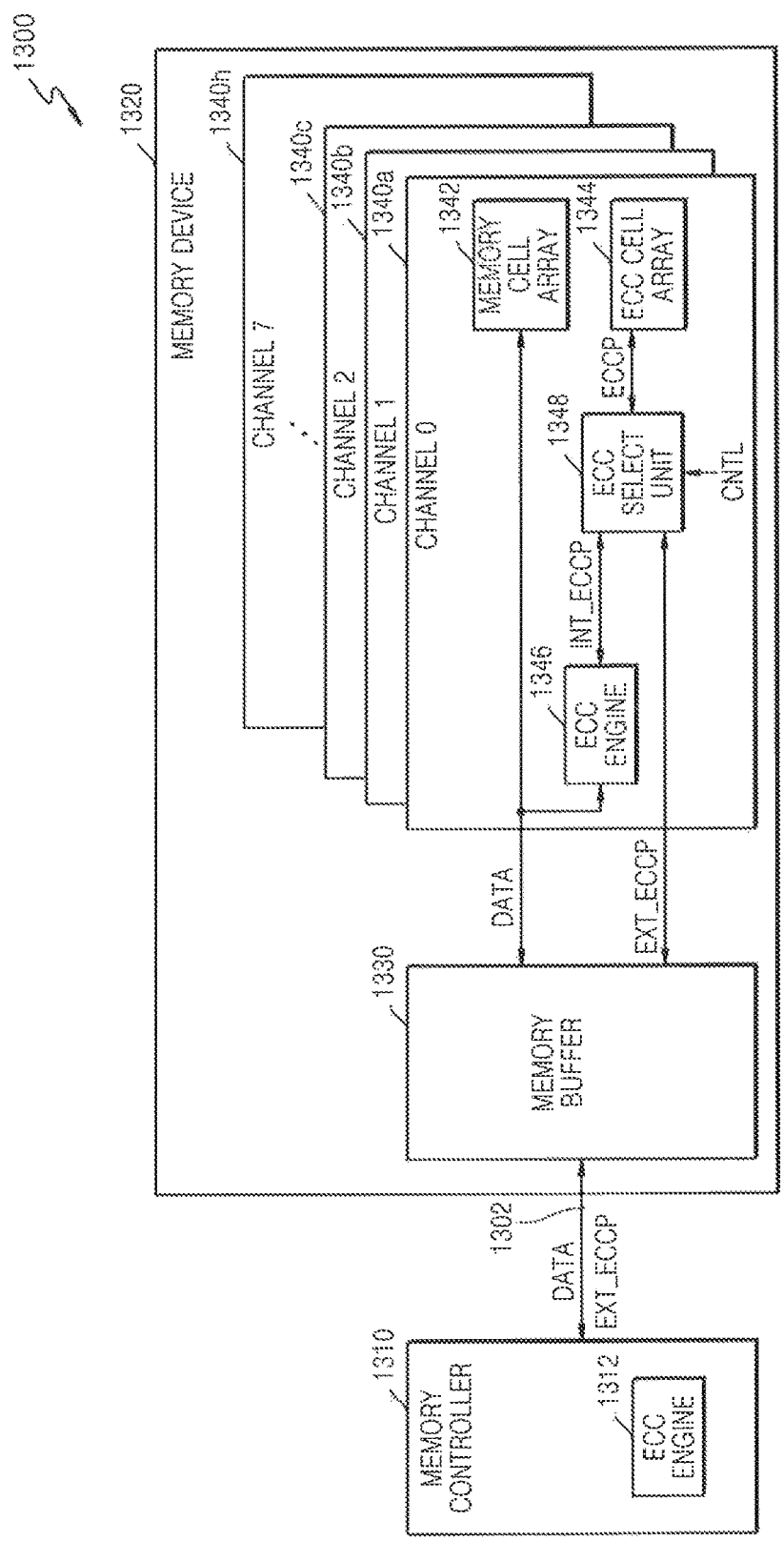
FIG. 13 is a diagram of a memory system including a memory device having a shareable ECC cell array, according to an exemplary embodiment of the inventive concept.

FIG. 13 is a diagram of a memory system 1300 including a memory device 1320 having a shareable ECC cell array 1344, according to an exemplary embodiment of the inventive concept.

Referring to FIG. 13, the memory system 1300 is different from the memory system 1100 of FIG. 11 in that the external parity bits EXT_ECCP provided by an external ECC engine 1312 of a memory controller 1310 are transmitted to the memory device 1320 through a data bus 1302. Accordingly, a description of memory buffer 1330, memory layers 1340a through 1340h, memory cell array 1342, internal ECC engine 1346, ECC select unit 1348 and the sharable ECC cell array 1344 will not be provided or limited. The memory controller 1310 may transmit the data DATA and the external parity bits EXT_ECCP corresponding to the data DATA through the data bus 1302 in a sequential or interleaved manner.

According to an exemplary embodiment of the inventive concept, the external ECC engine 1312 may generate the external parity bits EXT_ECCP of 4 bytes by performing an ECC operation on the data DATA of 32 bytes. The memory controller 1310 may transmit data D00 through D31 of 32 bytes during first through fourth clock cycles C0 through C3 and transmit the external parity bits EXT_ECCP during a fifth clock cycle C4 in a sequential manner shown in FIG. 14. The external parity bits EXT_ECCP sequentially transmitted to the data bus 1302 may be transmitted to the ECC select unit 1348 of the memory layer 1340a through the memory buffer 1330 and selectively stored in the shareable ECC cell array 1344. The memory controller 1330 may operate in a DDR mode in which the data DATA and the external parity bits EXT_ECCP are transmitted during both of a rising edge and a falling edge of a clock.

According to an exemplary embodiment of the inventive concept, the memory controller 1310 may transmit the data D00 through D31 and the external parity bits EXT_ECCP during the first through fifth clock cycles C0 through C4 in an interleaved manner shown in FIG. 15. The external parity bits EXT_ECCP transmitted to the data bus 1302 in an interleaved manner may be transmitted to the ECC select unit 1348 of the memory layer 1340a through the memory buffer 1330 and selectively stored in the shareable ECC cell array 1344.

Figure 16:
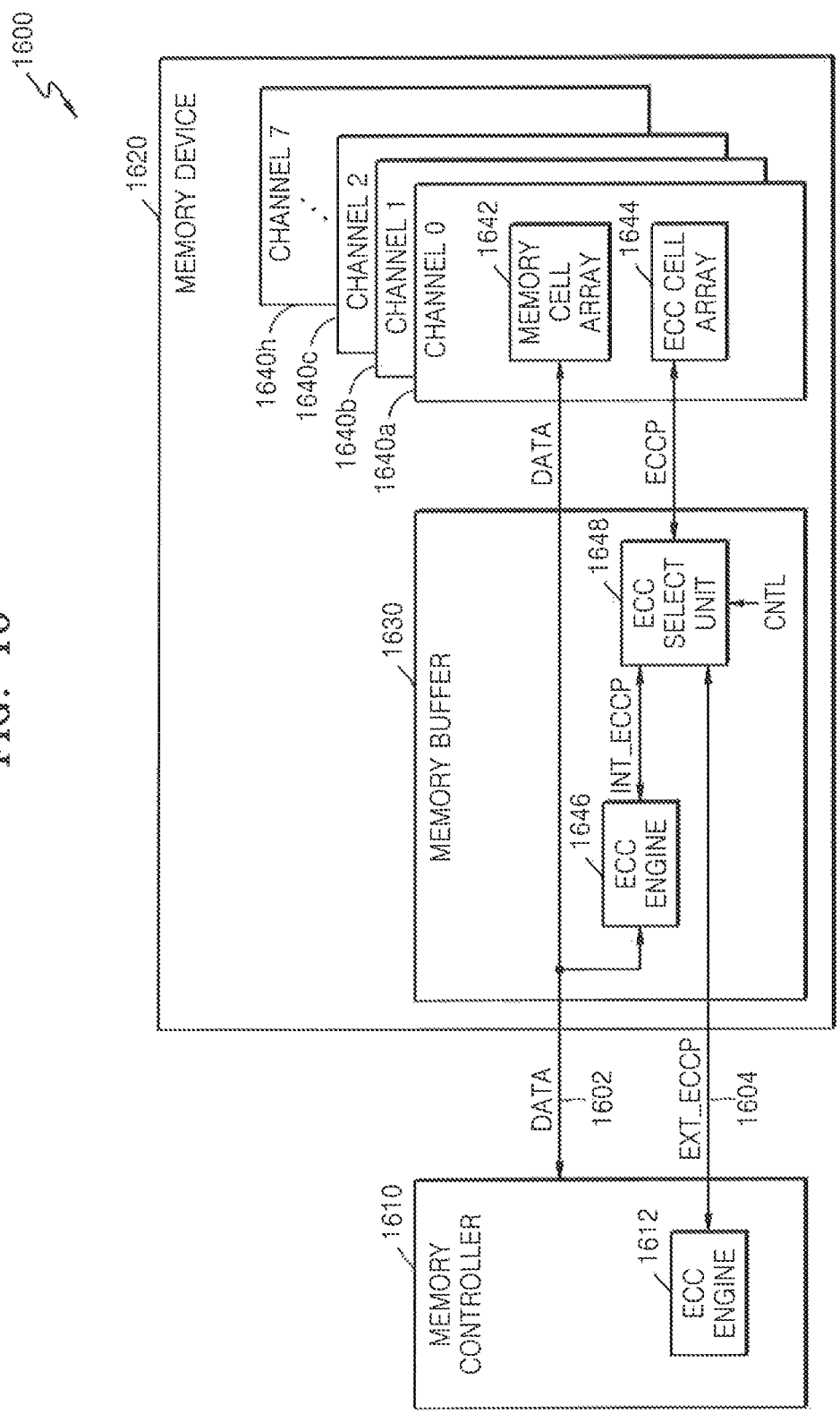
FIG. 16 is a diagram of a memory system including a memory device having a shareable ECC cell array, according to an exemplary embodiment of the inventive concept.

FIG. 16 is a diagram of a memory system 1600 including a memory device 1620 having a shareable ECC cell array 1644, according to an exemplary embodiment of the inventive concept.

Referring to FIG. 16, the memory system 1600 includes a memory controller 1610 and the memory device 1620. The memory device 1620 may be a memory device in which a memory buffer 1630 and a plurality of memory layers 1640a through 1640h are stacked on each other. The memory device 1620 may be connected to the memory controller 1610 through a data bus 1602 for exchanging data with the memory layers 1640a through 1640h, a parity bus 1604 for transmitting the external parity bits EXT_ECCP, and a control bus for transmitting a command/address/clock for instructing a reading or writing operation of data.

The memory controller 1610 may transmit the data DATA and the external parity bits EXT_ECCP corresponding to the data DATA together to guarantee the integrity of data transmitted to the memory device 1620. The memory controller 1610 may include an external ECC engine 1612 that generates the external parity bits EXT_ECCP by performing an ECC operation on the data DATA. The memory controller 1610 may transmit the data DATA to the memory device 1620 through the data bus 1602 and transmit the external parity bits EXT_ECCP to the memory device 1620 through the parity bus 1604.

The memory device 1620 may include the memory buffer 1630 and the plurality of memory layers 1640a through 1640h. The memory buffer 1630 may receive a command, an address, a clock, the data DATA, and the external parity bits EXT_ECCP from the memory controller 1610 and provide the command, address, clock, data DATA, and external parity bits EXT_ECCP to the memory layers 1640a through 1640h.

The memory layers 1640a through 1640h may be set to channels that include independent memory banks, are independently clocked, and include independent interfaces. For example, a memory bank of the memory layer 1640a may include a memory cell array 1642 and the shareable ECC cell array 1644.

The memory cell array 1642 may include a plurality of normal cells arranged in rows and columns, and the shareable ECC cell array 1644 may include a plurality of ECC cells arranged in rows and columns. The shareable ECC cell array 1644 may store ECC parity bits ECCP used in an ECC operation performed on data bits provided to and from the normal cells of the memory cell array 1642.

The memory buffer 1630 may include a signal distribution circuit, a signal reproducing circuit, and a signal synchronization circuit. The memory buffer 1630 may include a capacitive separation circuit, a voltage converting circuit including a voltage rising function and a voltage dropping function, and a multiplexing/de-multiplexing block including circuitry for a multiplexing function and a de-multiplexing function.

The memory buffer 1630 may include an internal ECC engine 1646 and an ECC select unit 1648. The internal ECC engine 1646 may perform an ECC function on data bits written to or read from the memory cell array 1642 of the memory layer 1640a. The internal ECC engine 1646 may receive the data DATA to be written to the normal cells of the memory cell array 1642 from the memory controller 1610 through the data bus 1602. The internal ECC engine 1646 may perform an ECC encoding operation to generate the internal parity bits INT_ECCP with respect to the data DATA. The internal ECC engine 1646 may perform an ECC decoding operation to detect and correct an error bit included in the data read from the normal cells of the memory cell array 1642 by using the ECC parity bits ECCP read from the shareable ECC cell array 1644.

The ECC select unit 1648 may receive the internal parity bits INT_ECCP generated by the internal ECC engine 1646 and the external parity bits EXT_ECCP provided from the external ECC engine 1612 of the memory controller 1610. The ECC select unit 1648 may select the internal parity bits INT_ECCP or the external parity bits EXT_ECCP in response to the ECC control signal CNTL and output the selected internal parity bits INT_ECCP or external parity bits EXT_ECCP as the ECC parity bits ECCP. The ECC parity bits ECCP may be stored in the shareable ECC cell array 1644 of the memory layer 1640a.

The ECC select unit 1648 may transmit the ECC parity bits ECCP read from the shareable ECC cell array 1644 to the internal ECC engine 1646 or to the memory controller 1610, in response to the ECC control signal CNTL. The ECC control signal CNTL may be generated based on an ECC command received from the memory controller 1610.

Figure 17:
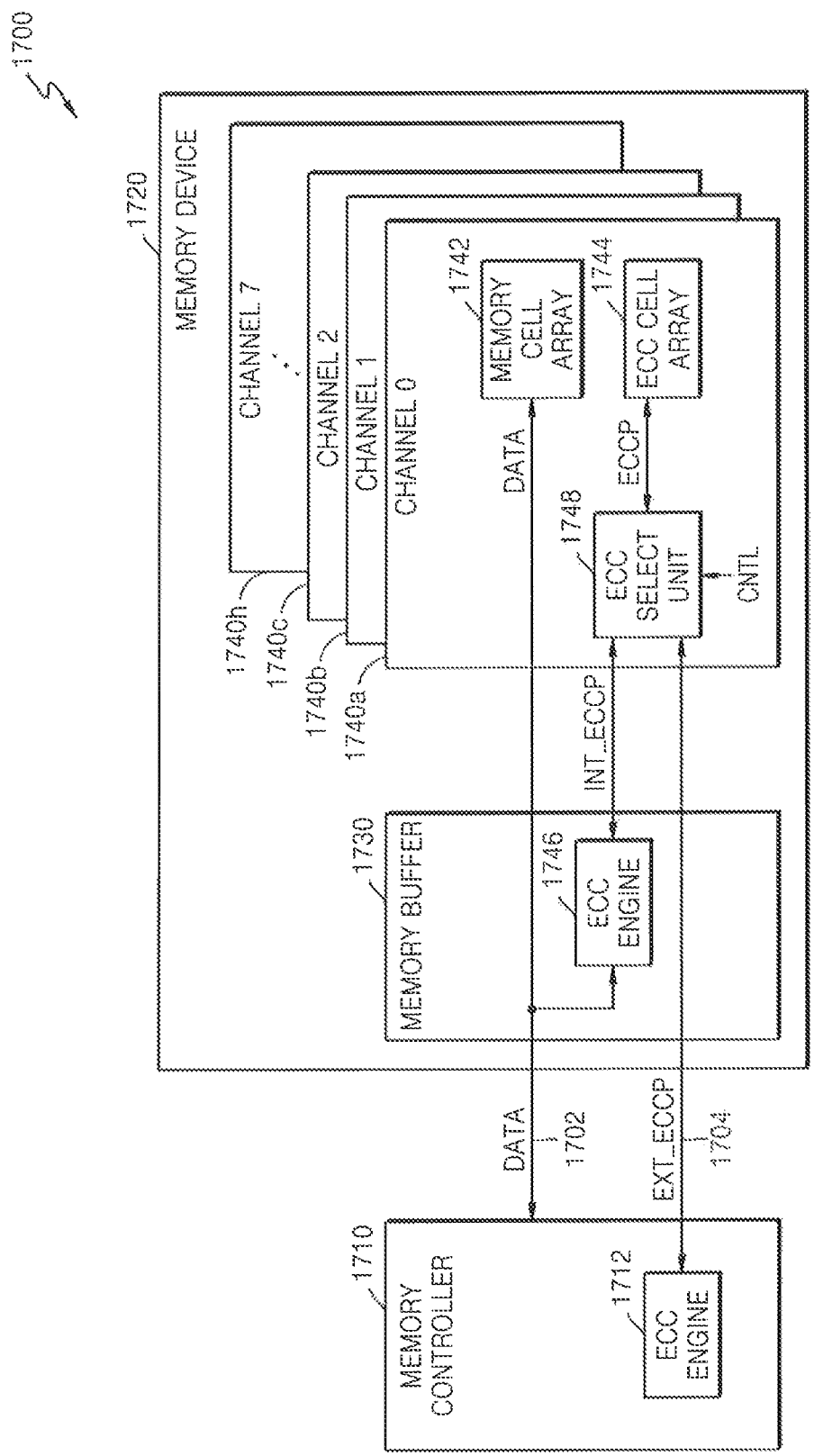
FIG. 17 is a diagram of a memory system including a memory device having a shareable ECC cell array, according to an exemplary embodiment of the inventive concept.

FIG. 17 is a diagram of a memory system 1700 including a memory device 1720 having a shareable ECC cell array 1744, according to an exemplary embodiment of the inventive concept.

Referring to FIG. 17, the memory system 1700 includes a memory controller 1710 and the memory device 1720. The memory device 1720 may be a memory device in which a memory buffer 1730 and a plurality of memory layers 1740a through 1740h are stacked on each other. The memory device 1720 may be connected to the memory controller 1710 through a data bus 1702 for exchanging data with the memory layers 1740a through 1740h, a parity bus 1704 for transmitting the external parity bits EXT_ECCP, and a control bus for transmitting a command/address/clock for instructing a reading or writing operation of data.

The memory controller 1710 may transmit the data DATA and the external parity bits EXT_ECCP corresponding to the data DATA together to guarantee the integrity of data transmitted to the memory device 1720. The memory controller 1710 may include an external ECC engine 1712 that generates the external parity bits EXT_ECCP by performing an ECC operation on the data DATA. The memory controller 1710 may transmit the data DATA to the memory device 1720 through the data bus 1702 and transmit the external parity bits EXT_ECCP to the memory device 1720 through the parity bus 1704.

The memory device 1720 may include the memory buffer 1730 and the plurality of memory layers 1740a through 1740h. The memory buffer 1730 may receive a command, an address, a clock, the data DATA, and the external parity bits EXT_ECCP from the memory controller 1710 and provide the command, address, clock, data DATA, and external parity bits EXT_ECCP to the memory layers 1740a through 1740h.

The memory buffer 1730 may include a signal distribution circuit, a signal reproducing circuit, and a signal synchronization circuit. The memory buffer 1730 may include a capacitive separation circuit, a voltage converting circuit including a voltage rising function and a voltage dropping function, and a multiplexing/de-multiplexing block including circuitry for a multiplexing function and a de-multiplexing function. The memory buffer 1730 may include an internal ECC engine 1746.

The internal ECC engine 1746 may perform an ECC function on data bits written to or read from a memory cell array 1742 of the memory layer 1740a. The internal ECC engine 1746 may receive the data DATA to be written to the normal cells of the memory cell array 1742 from the memory controller 1710 through the data bus 1702. The internal ECC engine 1746 may perform an ECC encoding operation to generate the internal parity bits INT_ECCP with respect to the data DATA. The internal ECC engine 1746 may perform an ECC decoding operation to detect and correct an error bit included in the data read from the normal cells of the memory cell array 1742 by using the ECC parity bits ECCP read from the shareable ECC cell array 1744.

The memory layers 1740a through 1740h may be set to channels that include independent memory banks, are independently clocked, and include independent interfaces. For example, a memory bank of the memory layer 1740a may include the memory cell array 1742 and the shareable ECC cell array 1744 that stores the ECC parity bits ECCP used for an ECC operation performed on data bits provided to or from the normal cells of the memory cell array 1742. In addition, the memory layer 1740a may include an ECC select unit 1748.

The ECC select unit 1748 may receive the internal parity bits INT_ECCP generated by the internal ECC engine 1746 and the external parity bits EXT_ECCP provided from the external ECC engine 1712 of the memory controller 1710. The ECC select unit 1748 may select the internal parity bits INT_ECCP or the external parity bits EXT_ECCP in response to the ECC control signal CNTL and output the selected internal parity bits INT_ECCP or external parity bits EXT_ECCP as the ECC parity bits ECCP. The ECC parity bits ECCP may be stored in the shareable ECC cell array 1744 of the memory layer 1740a.

The ECC select unit 1748 may transmit the ECC parity bits ECCP read from the shareable ECC cell array 1744 to the internal ECC engine 1746 or to the memory controller 1710 through the memory buffer 1730, in response to the ECC control signal CNTL. The ECC control signal CNTL may be generated based on an ECC command received from the memory controller 1710.

Figure 18:
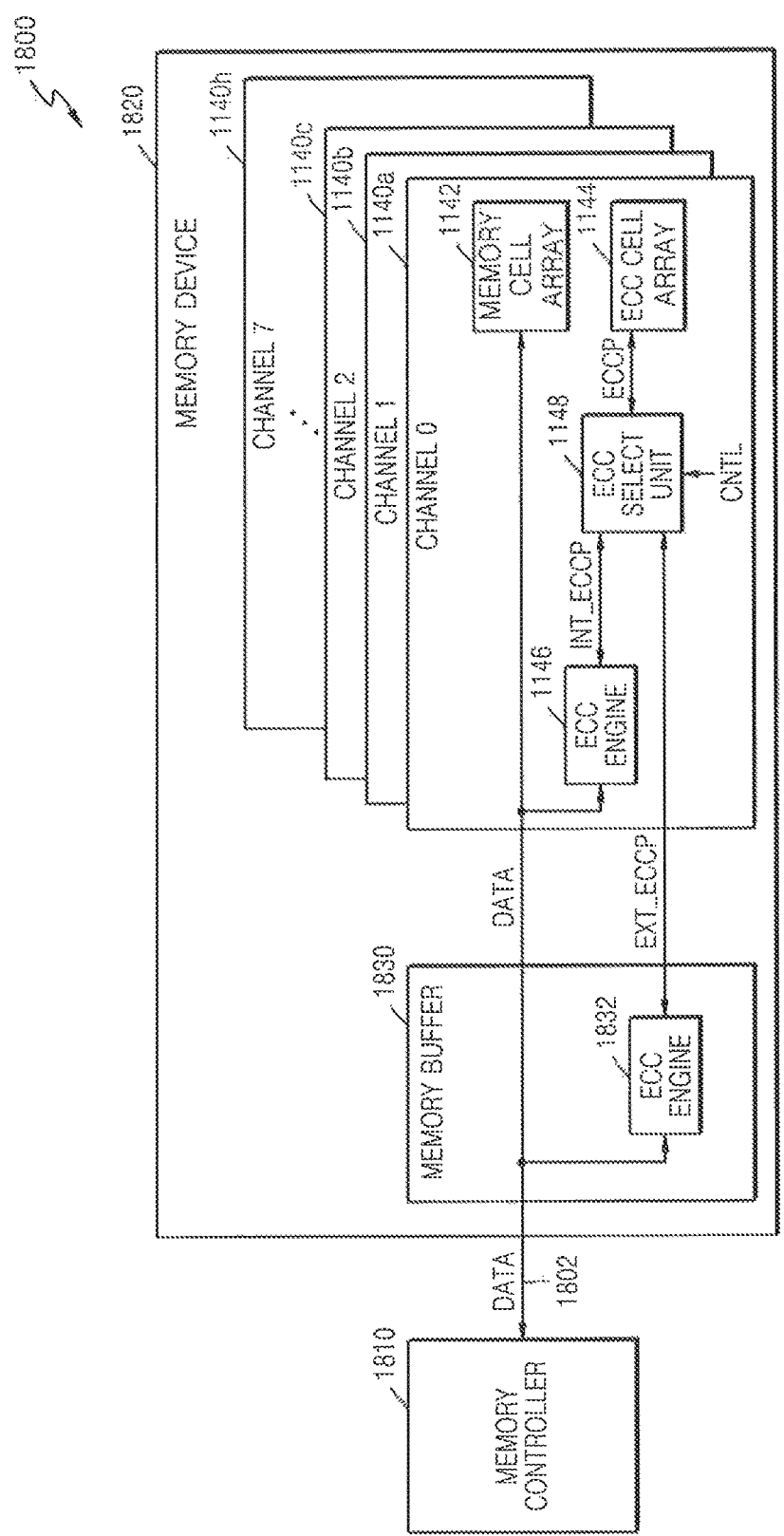
FIG. 18 is a diagram of a memory system including a memory device having a shareable ECC cell array, according to an exemplary embodiment of the inventive concept.

FIG. 18 is a diagram of a memory system 1800 including a memory device 1820 having the shareable ECC cell array 1144, according to an exemplary embodiment of the inventive concept.

Referring to FIG. 18, the memory system 1800 is different from the memory system 1100 of FIG. 11 in that an external ECC engine 1832 is not included in a memory controller 1810 but in a memory buffer 1830 of the memory device 1820.

The memory controller 1810 may be connected to the memory device 1820 through a data bus 1802 for exchanging data with the memory layers 1140a through 1140h and a control bus for transmitting a command/address/clock for instructing a reading or writing operation of data.

The memory device 1820 may include the memory buffer 1830 and the plurality of memory layers 1140a through 1140h. The memory buffer 1830 may receive a command, an address, a clock, and the data DATA from the memory controller 1810 and provide the command, address, clock, and data DATA to the memory layers 1140a through 1140h. The memory buffer 1830 may include a signal distribution circuit, a signal reproducing circuit, and a signal synchronization circuit. The memory buffer 1830 may include a capacitive separation circuit, a voltage converting circuit including a voltage rising function and a voltage dropping function, and a multiplexing/de-multiplexing block including circuitry for a multiplexing function and a de-multiplexing function.

The memory buffer 1830 may receive data DATA from the memory controller 1810 and generate the external parity bits EXT_ECCP corresponding to the received data DATA. The memory buffer 1830 may include the external ECC engine 1832 that generates the external parity bits EXT_ECCP by performing an ECC operation on the data DATA. The external parity bits EXT_ECCP may be transmitted to the memory layers 1140a through 1140h to which the data DATA is transmitted.

The memory layers 1140a through 1140h may be set to channels that include independent memory banks, are independently clocked, and include independent interfaces. Each of the memory layers 1140a through 1140h may receive a command, an address, a clock, the data DATA, and the external parity bits EXT_ECCP through the memory buffer 1830. A memory bank of the memory layer 1140a may include the memory cell array 1142 and the shareable ECC cell array 1144 that stores the ECC parity bits ECCP used for an ECC operation performed on data bits provided to or from the normal cells of the memory cell array 1142. In addition, the memory layer 1140a may include the internal ECC engine 1146 and the ECC select unit 1148.

The internal ECC engine 1146 may perform an ECC function on data bits written to or read from the memory cell array 1142. The internal ECC engine 1146 may perform an ECC encoding operation to generate the internal parity bits INT_ECCP with respect to the data bits written to the normal cells of the memory cell array 1142. The internal ECC engine 1146 may perform an ECC decoding operation to detect and correct an error bit included in the data bits read from the normal cells of the memory cell array 1142 by using the ECC parity bits ECCP read from the shareable ECC cell array 1144.

The ECC select unit 1148 may receive the internal parity bits INT_ECCP generated by the internal ECC engine 1146 and the external parity bits EXT_ECCP provided from the external ECC engine 1832 of the memory buffer 1830. The ECC select unit 1148 may select the internal parity bits INT_ECCP or the external parity bits EXT_ECCP in response to the ECC control signal CNTL and output the selected internal parity bits INT_ECCP or external parity bits EXT_ECCP as the ECC parity bits ECCP. The ECC parity bits ECCP may be stored in the shareable ECC cell array 1144.

The ECC select unit 1148 may transmit the ECC parity bits ECCP read from the shareable ECC cell array 1144 to the internal ECC engine 1146 or to the external ECC engine 1832 of the memory buffer 1830, in response to the ECC control signal CNTL. The ECC control signal CNTL may be provided from a mode register or a control signal storage unit of the memory layer 1140a, or may be generated based on an ECC command received from the memory controller 1810.

Figure 19:
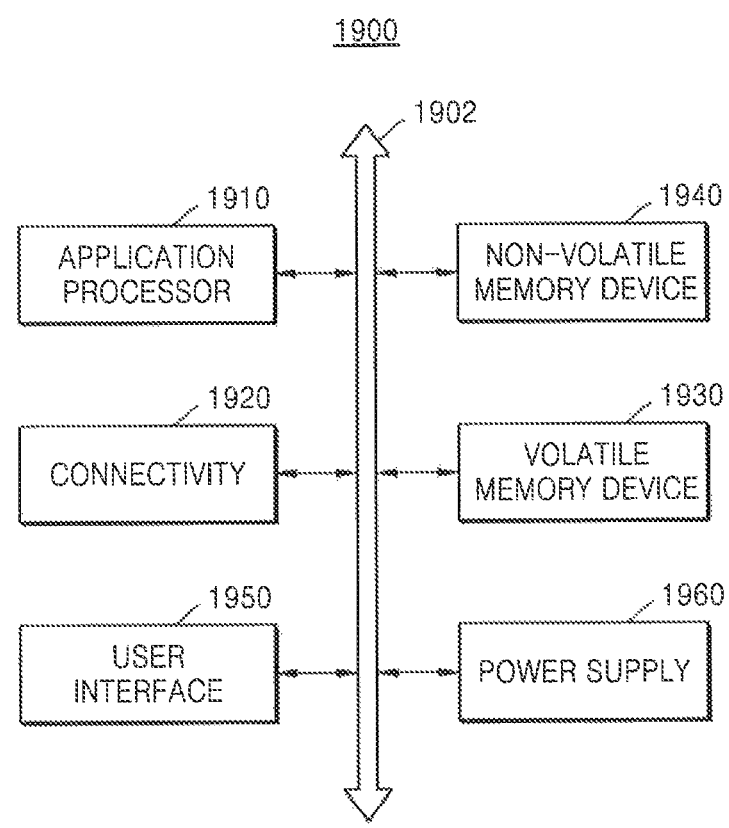
FIG. 19 is a block diagram of a mobile system to which a memory device having a shareable ECC cell array is applied, according to an exemplary embodiment of the inventive concept.

FIG. 19 is a block diagram of a mobile system 1900 to which a first memory device 1930 having a shareable ECC cell array is applied, according to an exemplary embodiment of the inventive concept.

Referring to FIG. 19, the mobile system 1900 may include an application processor 1910, a connectivity unit 1920, the first memory device 1930, a second memory device 1940, a user interface 1950, and a power supply source 1960, which are connected to each other via a bus 1902. The first memory device 1930 may be a volatile memory device, and the second memory device 1940 may be a nonvolatile memory device. According to an exemplary embodiment of the inventive concept, the mobile system 1900 may be any mobile system, such as a mobile phone, a smart phone, a personal digital assistant (PDA), a portable multimedia player (PMP), a digital camera, a music player, a portable game console, or a navigation system.

The application processor 1910 may execute applications that provide an Internet browser, a game, and a video. According to an exemplary embodiment of the inventive concept, the application processor 1910 may include a single core or a multi-core processor. For example, the application processor 1910 may include a dual-core, a quad-core, or a hexa-core processor. In addition, according to an exemplary embodiment of the inventive concept, the application processor 1910 may further include an internal or external cache memory.

The connectivity unit 1920 may perform wireless communication or wired communication with an external apparatus. For example, the connectivity unit 1920 may perform Ethernet communication, near field communication (NFC), radio frequency identification (RFID) communication, mobile telecommunication, memory card communication, or universal serial bus (USB) communication. For example, the connectivity unit 1920 may include a baseband chipset, and may support communication, such as global system for mobile communication (GSM), gross rating points (GRPS), wideband code division multiple access (WCDMA), or high speed packet access (HSxPA).

The first memory device 1930 that is a volatile memory device may store data processed by the application processor 1910 or may operate as a working memory. The first memory device 1930 may include a memory cell array that includes a plurality of memory cells, a shareable ECC cell array that stores ECC parity bits with respect to data written to the memory cells, an internal ECC engine that receives data and generates internal parity bits by performing an ECC operation on the received data, and an ECC select unit that receives external parity bits provided from an external source and the internal parity bits, and selects and outputs the external parity bits or the internal parity bits as ECC parity bits in response to a control signal.

The first memory device 1930 may include a memory buffer that receives data from an external source and generates the external parity bits corresponding to the received data, and memory layers that include independent memory banks and receive the data and the external parity bits from the memory buffer. A memory layer may include at least one of the memory banks that includes the memory cell array storing the data and the shareable ECC cell array storing the ECC parity bits, the internal ECC engine that receives the data and generates the internal parity bits by performing the ECC operation on the received data, and the ECC select unit that receives the external parity bits and the internal parity bits, and selects and outputs the external parity bits or the internal parity bits as the ECC parity bits.

Since the external parity bits and the internal parity bits are stored by using the shareable ECC cell array, the first memory device 1930 may have a reduced chip size overhead.

The second memory device 1940 that is a nonvolatile memory device may store a boot image for booting the mobile system 1900. For example, the second memory device 1940 may be an electrically erasable programmable read-only memory (EEPROM), a flash memory, a PRAM, an RRAM, a nano-floating gate memory (NFGM), a polymer random access memory (PoRAM), an MRAM, a ferroelectric random access memory (FRAM), etc.

The user interface 1950 may include at least one input device, such as a keypad or a touch screen, and/or at least one output device, such as a speaker or a display device. The power supply source 1960 may supply an operation voltage. In addition, according to an exemplary embodiment of the inventive concept, the mobile system 1900 may further include a camera image processor (CIP), and may further include a storage device, such as a memory card, a solid state drive (SSD), a hard disk drive (HDD), or a CD-ROM.

Figure 20:
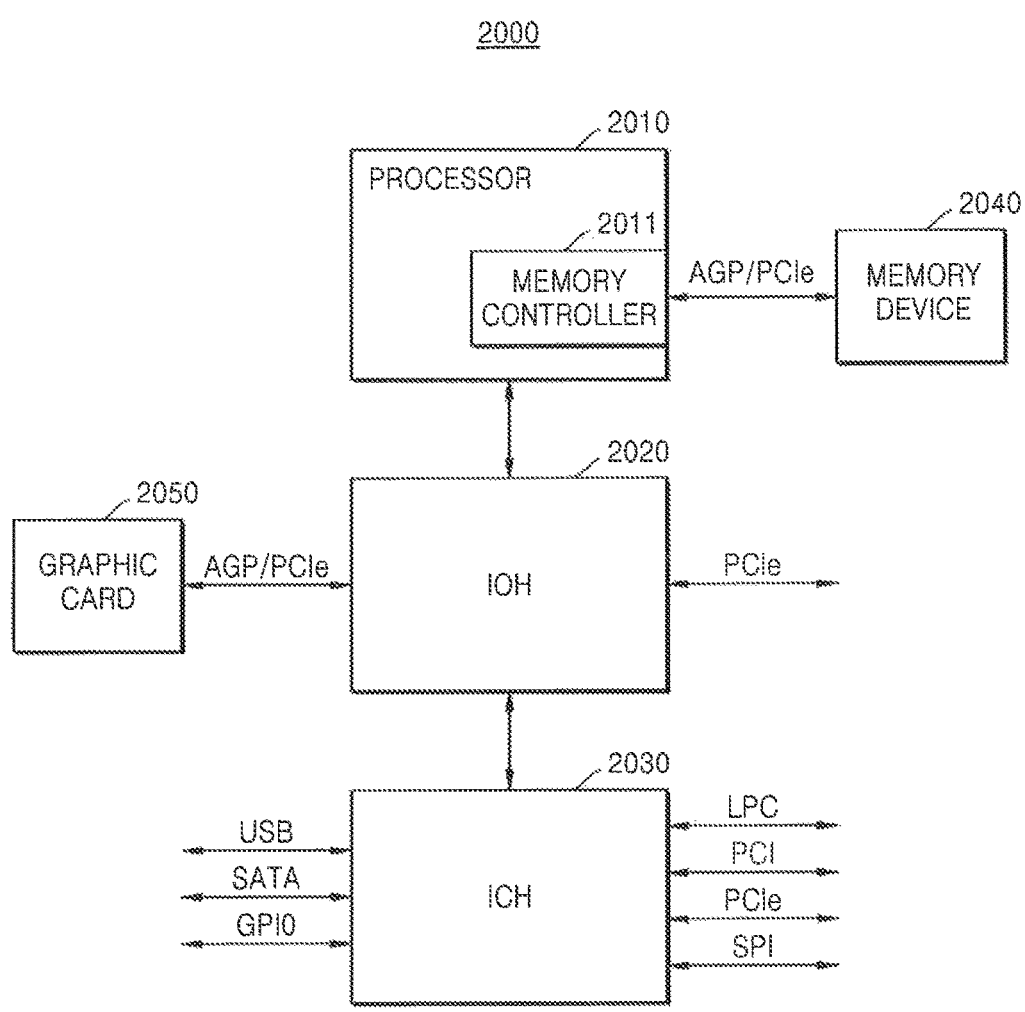
FIG. 20 is a block diagram of a computing system to which a memory device having a shareable ECC cell array is applied, according to an exemplary embodiment of the inventive concept.

FIG. 20 is a block diagram of a computing system 2000 to which a memory device 2040 having a shareable ECC cell array is applied, according to an exemplary embodiment of the inventive concept.

Referring to FIG. 20, the computing system 2000 includes a processor 2010, an I/O hub (IOH) 2020, an I/O controller hub (ICH) 2030, the memory device 2040, and a graphics card 2050. According to an exemplary embodiment of the inventive concept, the computing system 2000 may be any computing system, such as a personal computer (PC), a server computer, a workstation, a laptop, a mobile phone, a smart phone, a PDA, a PMP, a digital camera, a digital television (DTV), a set-top box, a music player, a portable game console, or a navigation system.

The processor 2010 may execute various computing functions, such as certain calculations or tasks. For example, the processor 2010 may be a microprocessor or a CPU. According to an exemplary embodiment of the inventive concept, the processor 2010 may include a single core or a multi-core processor. For example, the processor 2010 may include a dual-core, a quad-core, or a hexa-core processor. In addition, in FIG. 20, the computing system 2000 includes one processor 2010, but according to an exemplary embodiment of the inventive concept, the computing system 2000 may include a plurality of the processors 2010. In addition, according to an exemplary embodiment of the inventive concept, the processor 2010 may further include an internal or external cache memory.

The processor 2010 may include a memory controller 2011 that controls operations of the memory device 2040. The memory controller 2011 included in the processor 2010 may be an integrated memory controller (IMC). According to an exemplary embodiment of the inventive concept, the memory controller 2011 may be disposed inside the IOH 2020. The IOH 2020, including the memory controller 2011, may be a memory controller hub (MCH).

The memory device 2040 may include a plurality of memory layers and a memory buffer, which store data provided from the memory controller 2011. The memory buffer may receive a command, an address, a clock, and data from the memory controller 2011 and provide the received command, address, clock, and data to the memory layers. The memory layers may form a plurality of independent interfaces called channels. At least one of the channels includes independent memory banks, and a memory bank may include a memory cell array storing data and the shareable ECC cell array storing ECC parity bits. The memory layer may include an internal ECC engine that receives data and generates internal parity bits by performing an ECC operation on the received data, and an ECC select unit that receives external parity bits and the internal parity bits and selects and outputs the external parity bits or the internal parity bits as ECC parity bits. Since the external parity bits and the internal parity bits are stored by using the shareable ECC cell array, the memory layers may reduce a chip size overhead of the memory device 2040.

The IOH 2020 may manage data transmission between apparatuses, such as the graphics card 2050, and the processor 2010. The IOH 2020 may be connected to the processor 2010 via any type of interface. For example, the IOH 2020 and the processor 2010 may be connected to each other via an interface according to any of various standards, such as a front side bus (FSB), a system bus, a HyperTransport, a lighting data transport (LDT), a quick path interconnect (QPI), a common system interface, and a peripheral component interface-express (CSI). In FIG. 20, the computing system 2000 includes one IOH 2020, but according to an exemplary embodiment of the inventive concept, the computing system 2000 may include a plurality of the IOHs 2020.

The IOH 2020 may provide various interfaces with apparatuses. For example, the IOH 2020 may provide an accelerated graphics port (AGP) interface, a peripheral component interface-express (PCIe) interface, or a communication streaming architecture (CSA) interface.

The graphics card 2050 may be connected to the IOH 2020 through AGP or PCIe. The memory device 2040 and the memory controller 2011 may be connected to each other through AGP or PCIe. The graphics card 2050 may control a display device for displaying an image. The graphics card 2050 may include an internal processor and an internal semiconductor memory device for processing image data. According to an exemplary embodiment of the inventive concept, the IOH 2020 may include a graphics device therein together with or instead of the graphics card 2050 disposed outside the IOH 2020. The graphics device included in the IOH 2020 may be an integrated graphics. In addition, the IOH 2020, including a memory controller and a graphics device, may be a graphics and memory controller hub (GMCH).

The ICH 2030 may perform data buffering and interface arbitration such that various system interfaces efficiently operate. The ICH 2030 may be connected to the IOH 2020 through an internal bus. For example, the IOH 2020 and the ICH 2030 may be connected to each other via a direct media interface (DMI), a hub interface, an enterprise Southbridge interface (ESI), or PCIe.

The ICH 2030 may provide various interfaces with peripheral devices. For example, the ICH 2030 may provide a USB port, a serial advanced technology attachment (SATA), a general purpose I/O (GPIO), a low pin count (LPC) bus, a serial peripheral interface (SPI), a PCI, or a PCIe.

According to an exemplary embodiment of the inventive concept, at least two of the processor 2010, the IOH 2020, and the ICH 2030 may be included in one chipset.

While the inventive concept has been described with reference to exemplary embodiments thereof, it will be understood by those of ordinary skill in the art that various changes in form and details may be made therein without departing from the spirit and scope of the inventive concept as defined by the following claims.

What is claimed is:

1. A memory device, comprising:
   a memory cell array;
   an error correction code (FCC) cell array;
   an ECC engine configured to receive write data to be written to the memory cell array and generate internal parity bits for the write data; and
   an ECC select unit configured to receive the internal parity bits and external parity bits and, in response to a first level of a control signal, store the internal parity bits in the ECC cell array and, in response to a second level of the control signal, store the external parity bits in the ECC cell array.

2. The memory device of claim 1, wherein the write data and the external parity bits are provided from a memory controller.

3. The memory device of claim 1, wherein the control signal is provided from a memory controller.

4. The memory device of claim 1, wherein the control signal is programmed in a control signal storage unit which comprises a one-time programmable memory including a laser-programmable fuse memory, an anti-fuse memory, or an electric programmable fuse memory.

5. The memory device of claim 1, wherein the memory device is a dynamic random access memory (DRAM).

6. The memory device of claim 5, wherein the level of the control signal is programmed into one of the first level and the second level during a mode register setting procedure.

7. The memory device of claim 1, wherein the ECC select unit operates as a multiplexer that outputs the internal parity bits or the external parity bits in response to the control signal during a write operation.

8. A memory device, comprising:
   a memory buffer; and
   a plurality of memory layers, wherein each memory layer has at least one channel and each channel includes:
   an error correction code (ECC) cell array;
   an ECC engine configured to receive write data to be written to a memory cell array of the channel and generate internal parity bits for the write data; and
   an ECC select unit configured to receive the internal parity bits and external parity bits and, in response to a first level of a control signal, store the internal parity bits in the ECC cell array and, in response to a second level of the control signal store the external parity bits in the ECC cell array.

9. The memory device of claim 8, wherein first and second channels are disposed on a first memory layer and third and fourth channels are disposed on a second memory layer, the first and second memory layers are stacked on each other.

10. The memory device of claim 9, wherein the first and second memory layers are connected to each other with through silicon vias.

11. The memory device of claim 8, wherein the memory buffer receives the external parity bits and transmits the external parity bits to the at least one channel.

12. The memory device of claim 8, wherein the external parity bits are transferred from a memory controller to the memory buffer via a data lane, and the external parity bits are transferred after the data is transferred in a sequential transmission.

13. The memory device of claim 8, wherein the external parity bits and the data are transferred from a memory controller to the memory buffer at the same time via a parity bus and a data bus, respectively.

14. A memory system, comprising:
    a memory controller configured to generate external parity bits with data; and
    a memory device including:
    a memory buffer configured to receive the external parity bits and the data from the memory controller, and
    a plurality of memory layers, wherein each memory layer has at least one channel and each channel includes:
    an error correction code (ECC) cell array;
    an ECC engine configured to receive the data from the memory buffer, which is to be written to a memory cell array of the channels, and generate internal parity bits for the data; and
    an ECC select unit configured to receive the internal parity bits from the ECC engine and the external parity bits from the memory buffer and, in response to a first level of a control signal, store the internal parity bits in the ECC cell array and, in response to a second level of the control signal, store the external parity bits in the ECC cell array.

15. The memory system of claim 14, wherein a first channel is disposed on a first memory layer and a second channel is disposed on a second memory layer.

16. The memory system of claim 15, wherein the first and second channels are independently operated by the memory buffer.

17. The memory system of claim 14, wherein the external parity bits are transferred from the memory controller to the memory buffer via a data lane.

18. The memory system of claim 17, wherein the external parity bits are transferred after the data is transferred in a sequential transmission.

19. The memory system of claim 17, wherein the external parity bits are interleaved with the data bits in an interleaved transmission.

20. The memory system of claim 14, wherein the external parity bits and the data are transfer red from the memory controller to the memory buffer at the same time via a parity bus and a data bus, respectively.

* * * * *